United States Patent [19]

Morita et al.

[11] Patent Number: 5,667,129
[45] Date of Patent: Sep. 16, 1997

[54] IC COMPONENT MOUNTING METHOD AND APPARATUS

[75] Inventors: Koichi Morita, Osaka; Yoshihiko Misawa, Katano; Keiji Saeki, Kobe; Akira Kabeshita, Hirakata; Nobuhisa Watanabe, Kobe, all of Japan

[73] Assignee: Matsushita Electric Industrial Co., Ltd., Osaka-fu, Japan

[21] Appl. No.: 432,579

[22] Filed: May 1, 1995

[30] Foreign Application Priority Data

May 6, 1994 [JP] Japan ................................ 6-094556

[51] Int. Cl.⁶ .................................................. H01L 21/58
[52] U.S. Cl. .......................... 228/102; 228/6.2; 228/9; 228/105; 228/180.22; 348/87
[58] Field of Search ....................... 228/6.2, 9, 44.7, 228/102, 105, 180.21, 180.22; 348/87, 95

[56] References Cited

U.S. PATENT DOCUMENTS

| | | | |
|---|---|---|---|
| 4,628,464 | 12/1986 | McConnell | 348/87 X |
| 4,737,845 | 4/1988 | Susuki et al. | 228/105 |
| 4,896,811 | 1/1990 | Dunn et al. | 228/6.2 X |
| 4,984,731 | 1/1991 | Imamura | 228/102 |
| 5,285,946 | 2/1994 | Tomigashi et al. | 228/6.2 X |
| 5,425,491 | 6/1995 | Tanaka et al. | 228/44.7 |
| 5,471,310 | 11/1995 | Spigarelli et al. | 348/87 X |

*Primary Examiner*—Kenneth J. Ramsey
*Attorney, Agent, or Firm*—Wenderoth, Lind & Ponack

[57] ABSTRACT

An IC component mounting method includes sucking each of different types of IC components at a supply position to which the IC component having an electrode-provided face thereof to be bonded to a circuit board, recognizing an image of the IC component to detect a sucking position at which a sucking nozzle does not interfere with an electrode of the IC component, detecting a height of the sucking position, positioning the sucking nozzle at the sucking position while the position of the sucking nozzle in a vertical direction is controlled, sucking the IC component by a mounting head, recognizing a position of the IC component sucked by the mounting head, and recognizing a reference position of the circuit board or an IC component-mounting position thereof, and positioning the IC component at the IC component-mounting position of the circuit board and then mounting the IC component on the circuit board.

16 Claims, 26 Drawing Sheets

IC COMPONENT MOUNTING METHOD AND APPARATUS

BACKGROUND OF THE INVENTION

The present invention relates to an IC component-mounting method and apparatus preferably applicable in directly mounting an IC component, in particular, a flip chip or IC components on a circuit board or circuit boards.

The conventional method for mounting the IC component on the circuit board comprises the steps of supplying the IC component having a lead projecting from a side face thereof and accommodated in a package to a supply position; sucking the IC component at the supply position by a mounting head; recognizing the image of the posture of the sucked IC component by a component-recognizing portion; mounting the IC component on a mounting position of the circuit board by correcting the posture of the IC component being sucked by the mounting head; and soldering the lead of the IC component to an electrode of the circuit board.

Flip chip bonding is known as a method to replace wire bonding. In the flip chip bonding, an electrode of the flip chip is bonded to an electrode of an insulation board after the flip chip is mounted on the insulation board by turning an electrode-provided surface downward.

In recent years, in order to develop compact electronic equipments having high functions, there is a growing demand for the development of highly integrated and compact IC components. Hence, the recent tendency is to install many pins on the circuit board and IC components thereon at small pitches. It is conceivable to mount the flip chip IC directly on the circuit board as a method for manufacturing super-compact electronic equipments such as portable telephones or pocket word processors. In carrying out this method by utilizing the above-described conventional mounting method, it is necessary to supply the flip chip IC to the supply position by turning a bonding electrode-provided surface thereof downward (face-down). Consequently, in transporting the flip chip IC accommodated in a tray in the face-down posture, there is a possibility that bumps formed on the electrodes of the flip chip IC are damaged during transport and that hence an appropriate bonding state cannot be obtained on the circuit board after the flip chip IC is mounted on the circuit board. In order to overcome this problem, the flip chip IC is transported by accommodating them in a transport tray in the face-up state. In mounting the flip chip IC, it is taken out from the transport tray manually and accommodated in a mounting tray in the face-down state. This method has a low productivity and is incapable of solving the above-described problem because the flip chip IC is accommodated in the mounting tray in the face-down state.

In sucking the flip chip IC at the supply position by the sucking nozzle, there is a problem in that the sucking nozzle collides with the face of the flip chip IC strongly, thus damaging the circuit of the flip chip. This occurs is because the sucking nozzle may contact bumps, thus damaging them; an appropriate sucking state cannot be obtained; or the sucking nozzle merely moves downward to a certain position during the sucking operation.

Because many of the circuit boards comprise a multilayer board made of glass epoxy resin, the entire board is wavy and slight inclinations are generated on the surface of the board at each mounting position thereof due to irregularities caused by a wiring pattern of an underlayer. In mounting the flip chip IC directly on such a circuit board, there occurs a problem in that the bump of the flip chip IC cannot be appropriately bonded to the electrode of the circuit board.

A pressure-controlling method or a heat-controlling method are employed to mount the flip chip IC directly on the circuit board. But these methods cannot be carried out by the conventional IC component mounting apparatus.

In addition, if the flip chip IC is mounted on the circuit board by making the reference side of a circuit board-regulating means stationary, the mounting position of the circuit board is dislocated from a correct mounting position due to thermal expansion thereof. Thus, the flip chip IC cannot be mounted on the circuit board with high accuracy.

SUMMARY OF THE INVENTION

Accordingly, an object of the present invention is to provide an IC component mounting method and apparatus capable of preventing any damage from occurring on an electrode-provided face of an IC component and avoiding poor suction of the IC component.

In accomplishing these and other objects, according to a first aspect of the present invention, there is provided an IC component mounting method including the steps of:

sucking each of different types of IC components at a supply position to which the IC component having an electrode-provided face thereof to be bonded to a circuit board, recognizing an image of the IC component to detect a sucking position at which a sucking nozzle does not interfere with an electrode of the IC component, detect a height of the sucking position, position the sucking nozzle at the sucking position while the position of the sucking nozzle in a vertical direction is controlled;

sucking the IC component by a mounting head;

recognizing a position of the IC component sucked by the mounting head, and recognizing a reference position of the circuit board or an IC component-mounting position thereof; and positioning the IC component at the IC component-mounting position of the circuit board and then mounting the IC component on the circuit board.

According to a second aspect of the present invention, there is provided an IC component mounting method comprising steps of:

sucking each of a plurality of IC components by a mounting head;

recognizing a position of the IC component sucked by the mounting head, and recognizing a reference position of a position-regulated circuit board or one of IC component-mounting positions thereof; and positioning the IC component at the IC component-mounting position of the circuit board and then mounting the IC component on the circuit board, the method further comprising steps of:

detecting inclination of the circuit board at each IC component-mounting position in advance; and adjusting the inclination of a circuit board-setting table, on which the circuit board is set, according to the inclination of each of the IC component-mounting positions in mounting each of the IC components.

According to a third aspect of the present invention, there is provided an IC component mounting method comprising the steps of:

sucking an IC component by a mounting head;

recognizing a position of the IC component sucked by the mounting head, and recognizing a reference position of a position-regulated circuit board or an IC component-mounting position thereof; and mounting the IC component on the circuit board by positioning the IC component at the IC component-mounting position of the circuit board, wherein in the step of mounting the IC component on the circuit board, the IC component is heated while the position of the circuit board is unregulated.

According to a fourth aspect of the present invention, there is provided an IC component mounting apparatus comprising:

an IC component supply means for supplying each of different type of IC components to a supply position by turning an electrode-provided face thereof to be bonded to a circuit board upward;

a suction/inversion/transport means for sucking the IC component at the supply position, turning the IC component upside down, and transporting the IC component toward a transfer position, the suction/inversion/transport means including: a movable member reciprocating between the supply position and the transfer position, a sucking nozzle vertically movable and invertible, a height detection means, and an image-recognizing means, such that the sucking nozzle, the height detection means, and the image-recognizing means are installed on the movable member;

a circuit board-setting table for holding the circuit board on which the IC component is to be mounted, by regulating a position of the circuit board;

a mounting head including a tool for sucking the IC component at the transfer position and mounting the IC component on the circuit board at an IC component-mounting position thereof, and a circuit board-recognizing means for recognizing an image of a reference position of the circuit board or that of each of IC component-mounting positions; and a component-recognizing means for recognizing the position of the IC component sucked by the tool.

According to a fifth aspect of the present invention, there is provided an IC component mounting apparatus comprising:

an IC component supply means for supplying an IC component;

a circuit board-setting table for holding a circuit board on which the IC component is to be mounted, by regulating a position of the circuit board;

a mounting head including a tool for sucking the supplied IC component and mounting the IC component on the circuit board at an IC component-mounting position thereof, and a circuit board-recognizing means for recognizing an image of a reference position of the circuit board or that of the IC component-mounting position; and a component-recognizing means for recognizing the position of the IC component sucked by the tool, the mounting head comprising a means for applying a pressure to the tool; and a means for detecting the pressure applied to the tool.

According to a sixth aspect of the present invention, there is provided an IC component mounting apparatus comprising:

an IC component supply means for supplying an IC component;

a circuit board-setting table for holding a circuit board on which the IC component is to be mounted, by regulating a position of the circuit board;

a mounting head including a tool for sucking the supplied IC component and mounting the IC component on the circuit board at an IC component-mounting position thereof, and a circuit board-recognizing means for recognizing an image of a reference position of the circuit board or that of the IC component-mounting position;

a component-recognizing means for recognizing a position of the IC component sucked by the tool; and a heater and a temperature detection means both provided on a tool-installing portion of the mounting head.

According to a seventh aspect of the present invention, there is provided an IC component mounting apparatus comprising:

an IC component supply means for supplying an IC component;

a circuit board-setting table for holding a circuit board on which the IC component is to be mounted, by regulating a position of the circuit board;

a mounting head including a tool for sucking the supplied IC component and mounting the IC component on the circuit board at an IC component-mounting position thereof, and a circuit board-recognizing means for recognizing an image of a reference position of the circuit board or that of the IC component-mounting position;

a component-recognizing means for recognizing a position of the IC component sucked by the tool;

an automatic adjusting means for adjusting an inclination of the circuit board-setting table.

According to an eighth aspect of the present invention, there is provided an IC component mounting apparatus comprising:

an IC component supply means for supplying an IC component;

a circuit board-setting table for holding a circuit board on which the IC component is to be mounted, by regulating a position of the circuit board;

a mounting head including a tool for sucking the supplied IC component and mounting the IC component on the circuit board at an IC component-mounting position thereof, and a circuit board-recognizing means for recognizing an image of a reference position of the circuit board or that of the IC component-mounting position;

a heating means for heating the tool;

an IC component-recognizing means for recognizing a position of the IC component sucked by the tool;

a reference side-regulation means engaging two adjacent sides of four sides of the circuit board placed on the circuit board-setting table, thus regulating the position of the circuit board;

a movable side-regulation means for pressing the remaining two adjacent sides of the circuit board toward the reference side-regulation means, thus regulating the position of the circuit board; and a means for moving the reference side-regulation means toward a circuit board-unregulated position.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1A:
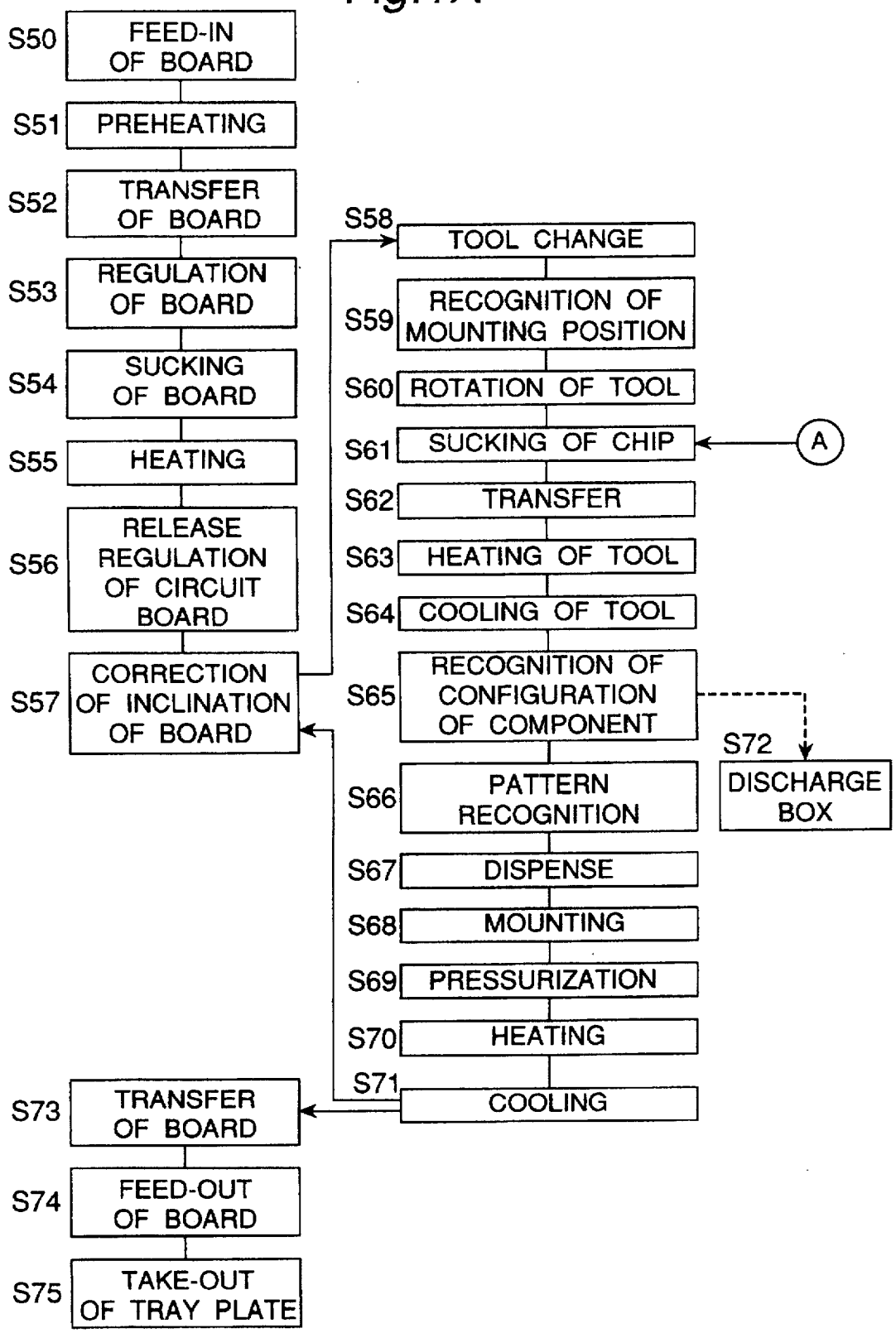
FIGS. 1A and 1B are a flowchart showing an IC component-mounting operation according to an embodiment of the present invention.

Before the description of the present invention proceeds, it is to be noted that like parts are designated by like reference numerals throughout the accompanying drawings.

An IC component mounting apparatus according to an embodiment of the present invention is described below with reference to FIGS. 1A, 1B, 2 through 29, and 30A and 30B.

Figure 2:
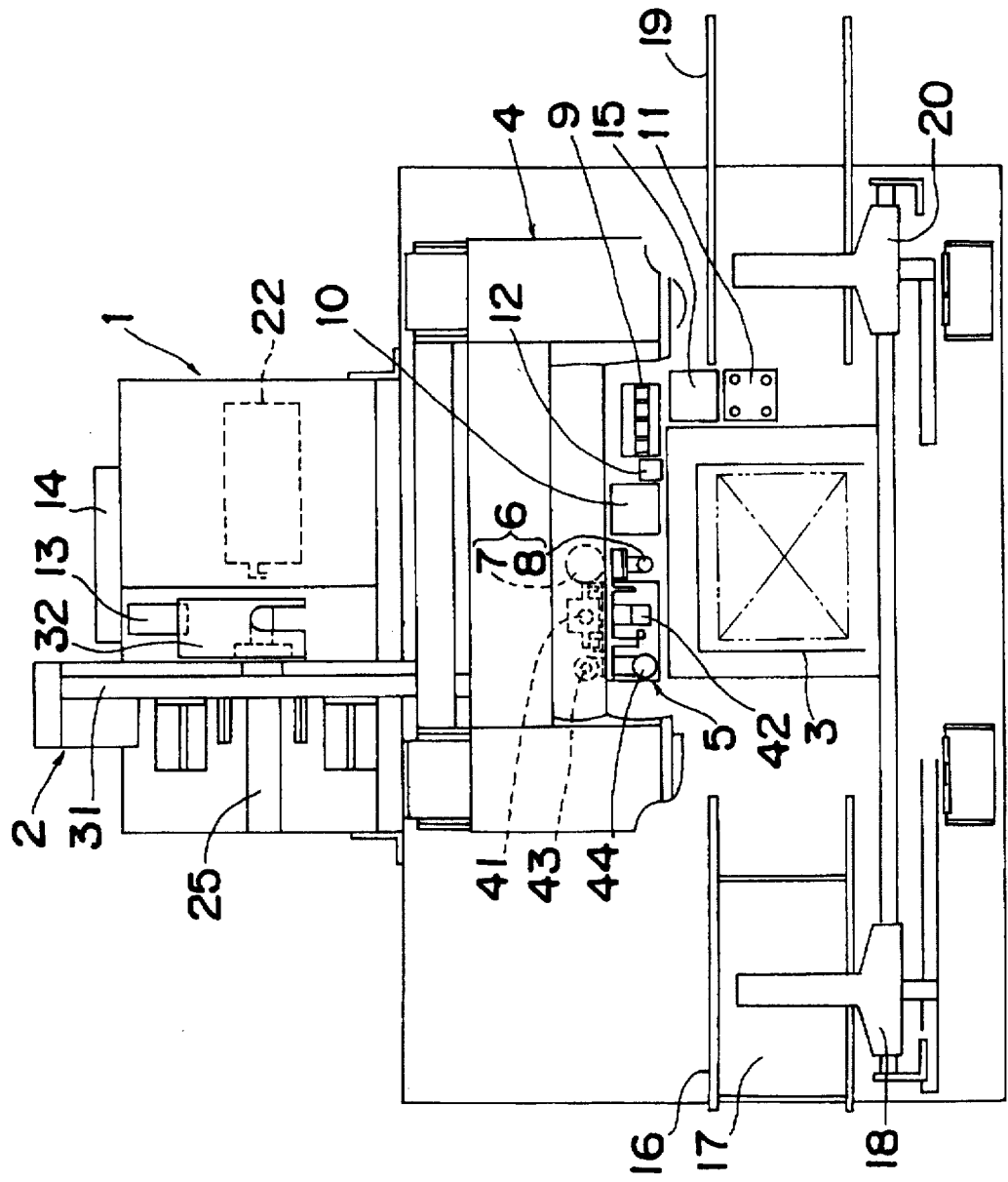
FIG. 2 is a plan view showing an entire IC component mounting apparatus according to the embodiment of the present invention.
Figure 3:
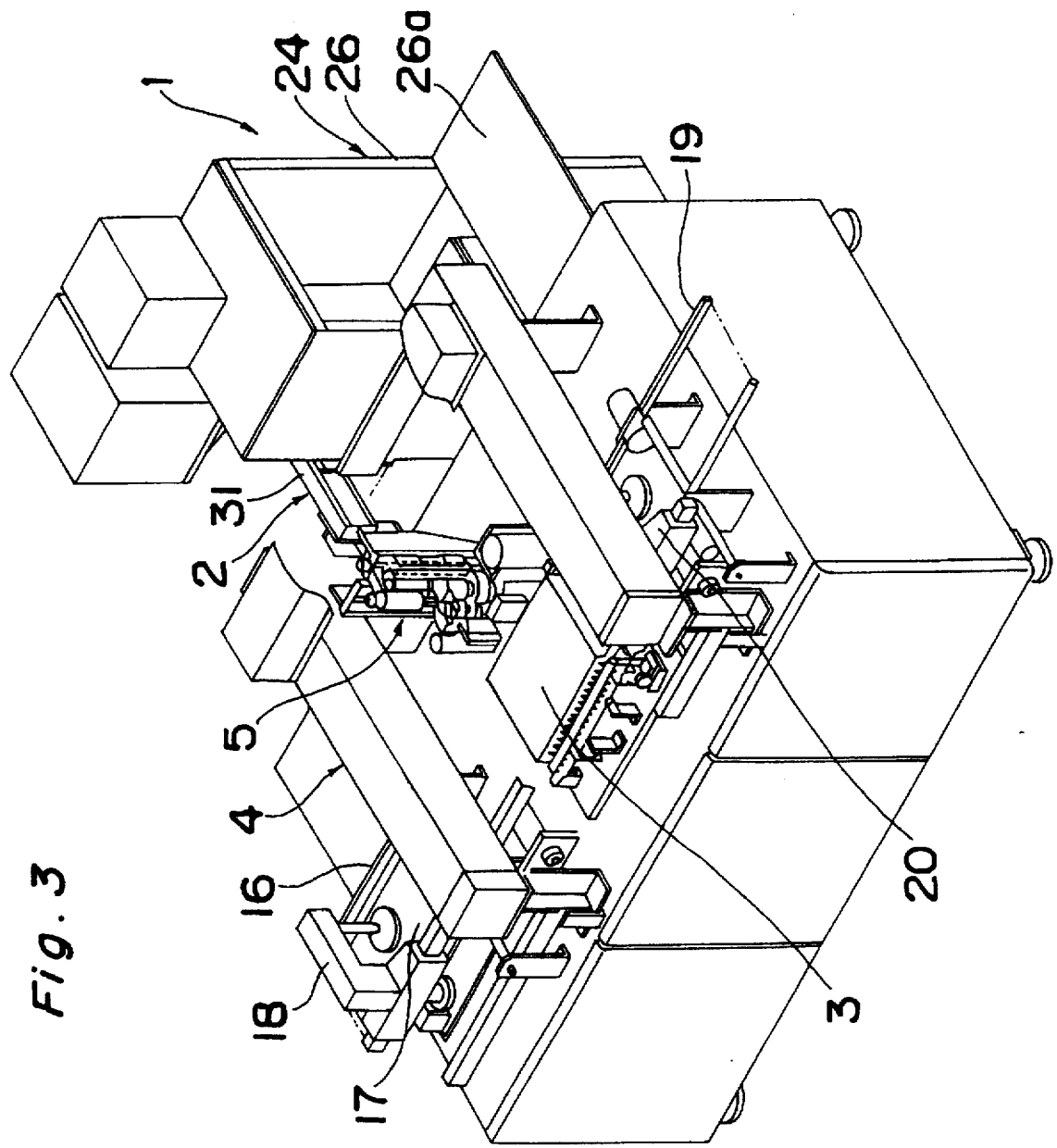
FIG. 3 is a perspective view showing the entire IC component mounting apparatus according to the embodiment of the present invention.

Referring to FIGS. 2 and 3, showing an entire construction of the IC component mounting apparatus, the apparatus comprises an IC component supply means 1; a suction/inversion/transport means 2; a circuit board-setting table 3; and a mounting robot 4. The IC component supply means 1 supplies an IC component (flip chip IC) to a supply position in a face-up posture, namely, by turning a connection electrode (bump)-provided face of the IC component upward. The suction/inversion/transport means 2 sucks the IC component at the supply position and then, turns the IC component upside down, namely, a face-down posture while it is transporting the IC component to a transfer position. The circuit board-setting table 3 holds a circuit board on which the IC component is to be mounted, by regulating the position of the circuit board. The mounting robot 4 moves a mounting head 5 in horizontal XY-directions and a vertical Z-direction and places the mounting head 5 at a desired position. The mounting head 5 sucks the IC component at the transfer position, thus mounting the sucked IC component at a desired position of the circuit board held on the circuit board-setting table 3, with the position of the circuit board regulated on the circuit board-setting table 3.

The apparatus further comprises an IC component recognizing means 6, including a recognizing camera 7 and a high accuracy-recognizing camera 8, for recognizing the sucked position of the IC component when the IC component is sucked by the mounting head 5; a tool changer 9 for replacing a tool 41 which sucks the IC component, depending on the kind of the IC component; a transfer means 10 for transferring bonding silver paste to the electrode (bump) of the IC component; a means 11 for detecting the parallel degree of the tool 41; a dislocation-detection means 12 having a jig for detecting mechanical dislocations of such as an optical system or guide devices which occur due to the elapse of time, thus correcting the dislocations; a nozzle changer 13; a discharge conveyor 14; and a discharge box 15. The recognizing camera 7 recognizes the outer configurations of the IC components, and the recognizing camera 8 recognizes patterns of the IC components or marks for positioning the IC components appropriately.

The apparatus further comprises a circuit board feed-in conveyor 16; a circuit board preheating means 17 for preheating the circuit board when the circuit board is fed thereto; a feed-in/movable means 18 for sucking the circuit board placed on the circuit board preheating means 17, thus transporting the circuit board to the circuit board-setting table 3 and placing the circuit board thereon; a circuit board feed-out conveyor 19; a feed-out/movable means 20 for sucking the circuit board placed on the circuit boardsetting table 3, thus transporting the circuit board to the feed-out conveyor 19.

Figure 4:
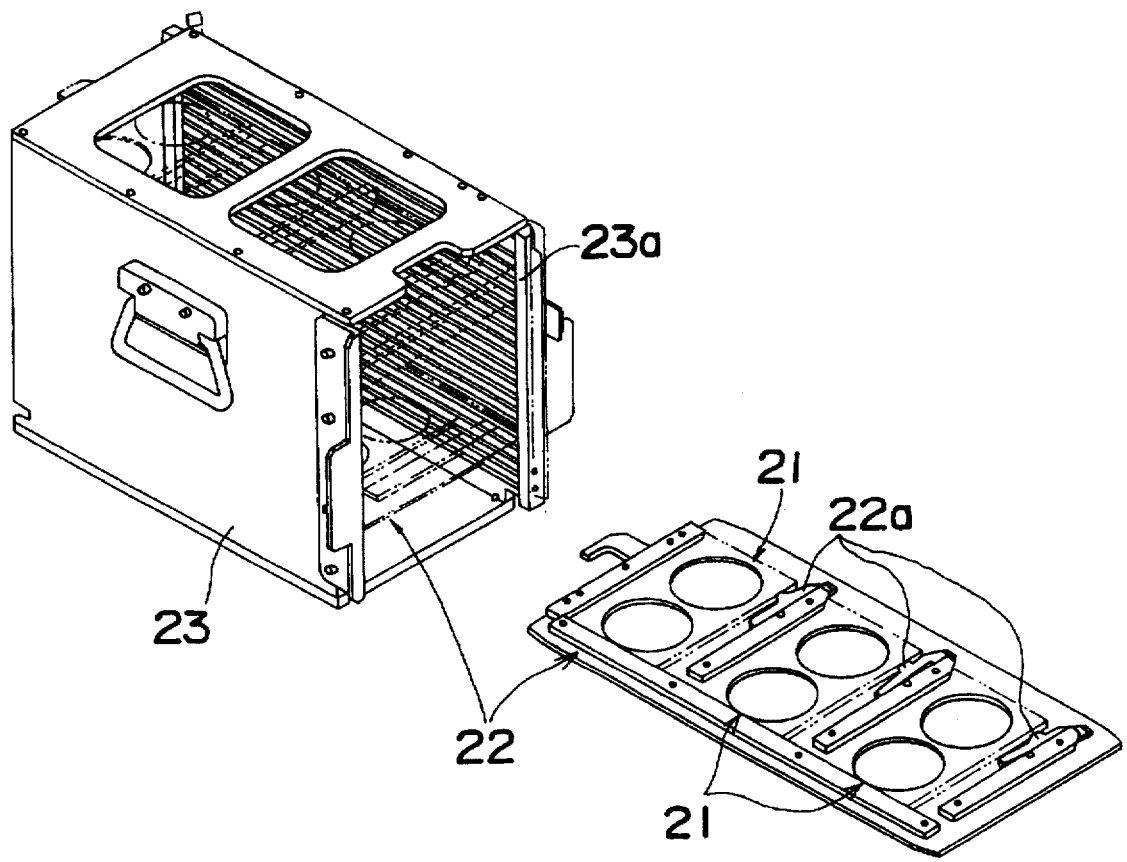
FIG. 4 is a perspective view showing a tray plate and a magazine according to the embodiment of the present invention.

Referring to FIG. 4, the IC component supply means 1 comprises tray plates 22 which hold a plurality of trays 21 accommodating the IC components in a matrix configuration in the face-up state and arranged in parallel with each other; and a magazine 23 which accommodates the tray plates 22 vertically in a plurality of stages and which supplies the IC components. The tray plate 22 has pressing members 22a for fixedly pressing the trays 21 downward. The magazine 23 has a removal-preventing strip 23a, pivotally mounted on one side edge thereof, for preventing the tray plates 22 from being removed therefrom.

Figure 5:
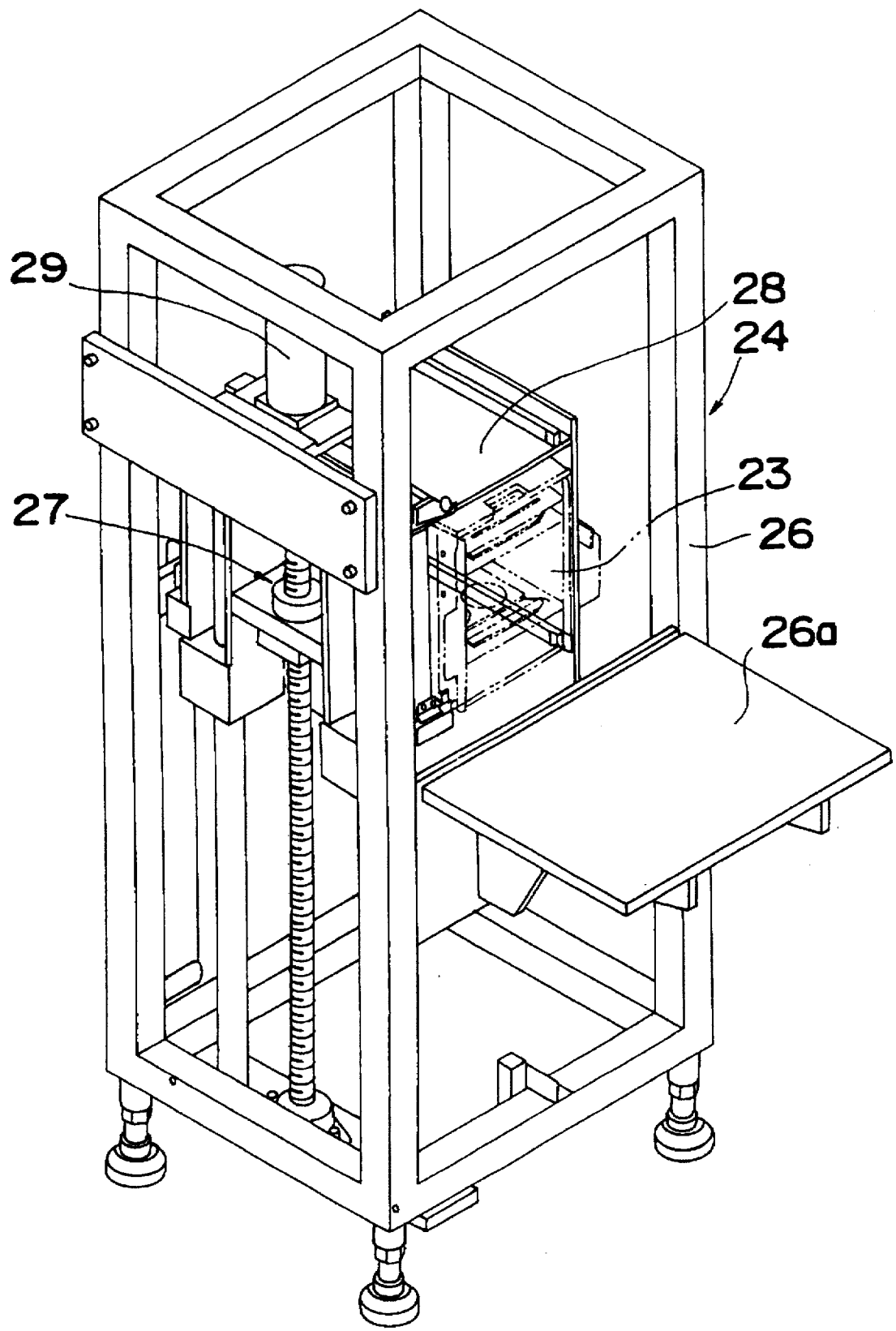
FIG. 5 is a perspective view showing a lifter according to the embodiment of the present invention.

The magazine 23 is installed on a lifter 24 as shown in FIG. 5 so as to position the desired tray plate 22 accommodated in the magazine 23 at a predetermined height and take out the desired tray plate 22 from the magazine 23 placed at the predetermined height by a take-out means 25 shown in FIG. 2. In this manner, the desired IC component accommodated in the tray 21 is placed at the supply position. The lifter 24 comprises a frame 26; an elevation frame 28; a feed screw mechanism 27; a magazine-placing base 26a installed on the frame 26; and a driving motor 29 for driving the feed screw mechanism 27. In the above construction, the magazine 23 is accommodated in the elevation frame 28 supported by the frame 26 and vertically movably driven by the feed screw mechanism 27.

Figure 6:
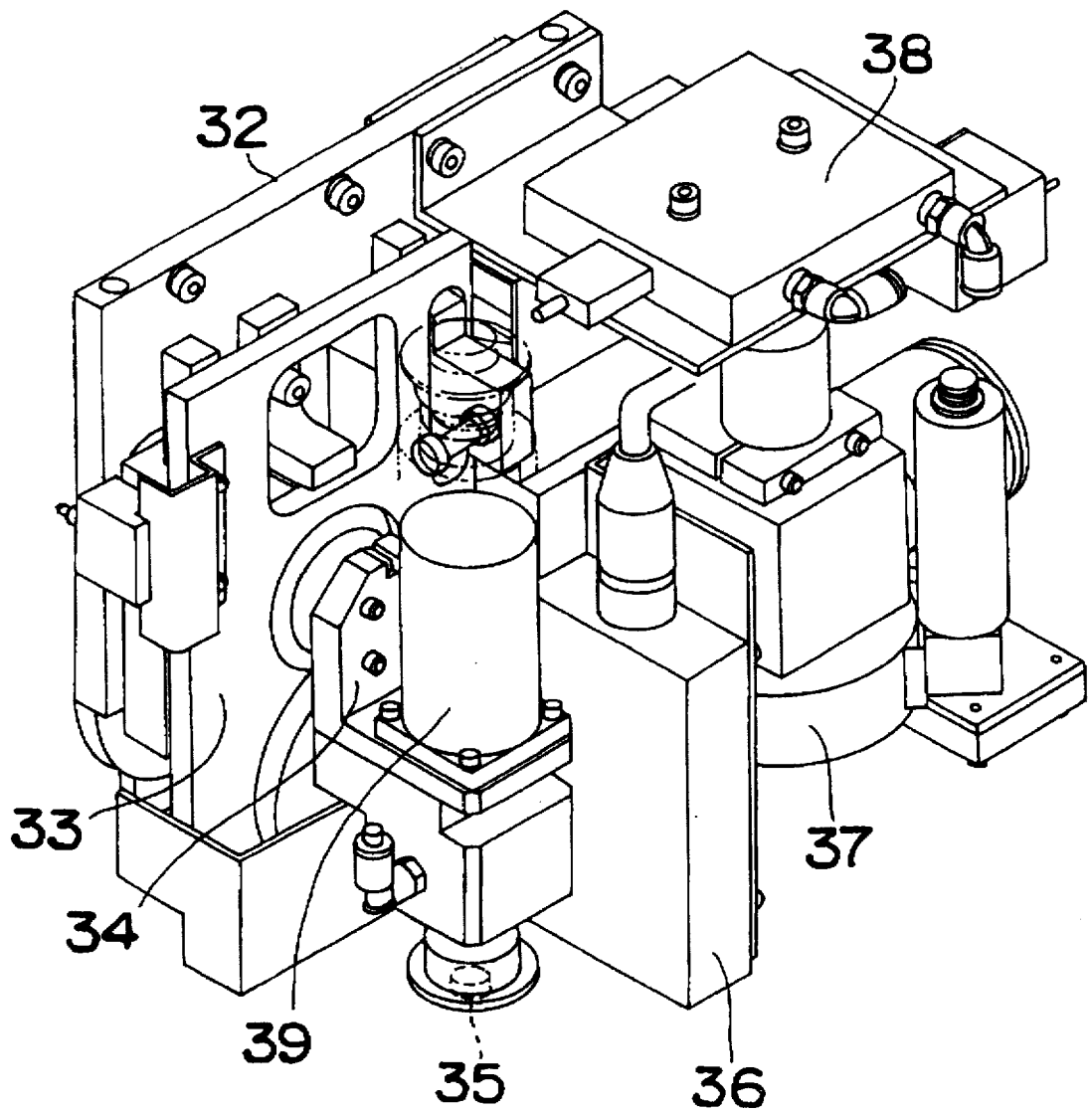
FIG. 6 is a perspective view showing an IC component suction/inversion/transport means according to the embodiment of the present invention.

As shown in FIG. 6, the suction/inversion/transport means 2 comprises a movable member 32 reciprocating between the supply position and the transfer position along a moving rail 31 (see FIG. 2) provided in a direction perpendicular to the tray plate take-out direction; an elevation base 33 provided on the movable member 32; an inversion frame 34 which is installed on the elevation base 33 and turned from the face-down posture to the face-up posture while the movable member 32 is moving from the supply position to the transfer position; and a sucking nozzle 35 provided on the inversion frame 34. The movable member 32 is provided with a height detection sensor 36 for detecting the height of the IC component at the supply position and a recognizing camera 37 for recognizing the image of the configuration of the IC component. The suction/inversion/transport means 2 further comprises an IC component-sucking unit 38 which detects a sucking pressure when the IC component is sucked, thus detecting whether or not the IC component is appropriately sucked; and a rotation means 39 for rotating the sucking nozzle 35.

Figure 8:
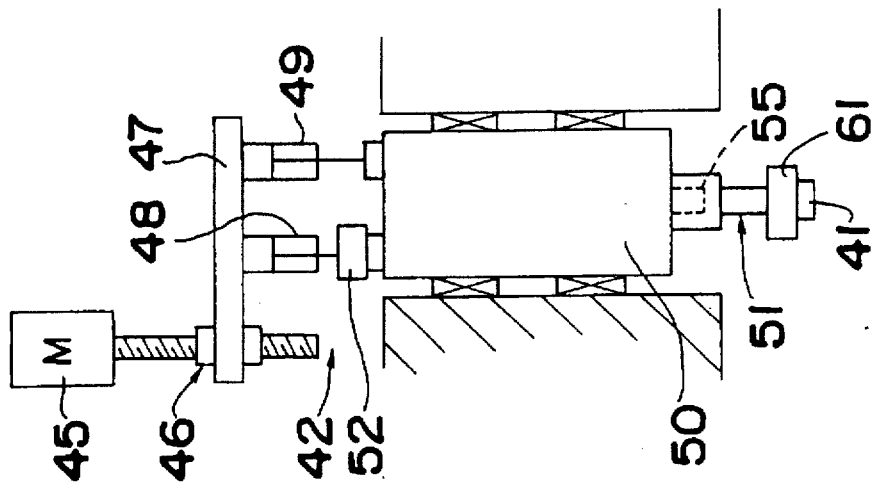
FIG. 8 is an illustration showing a pressurizing mechanism of the mounting head according to the embodiment of the present invention.
Figure 7:
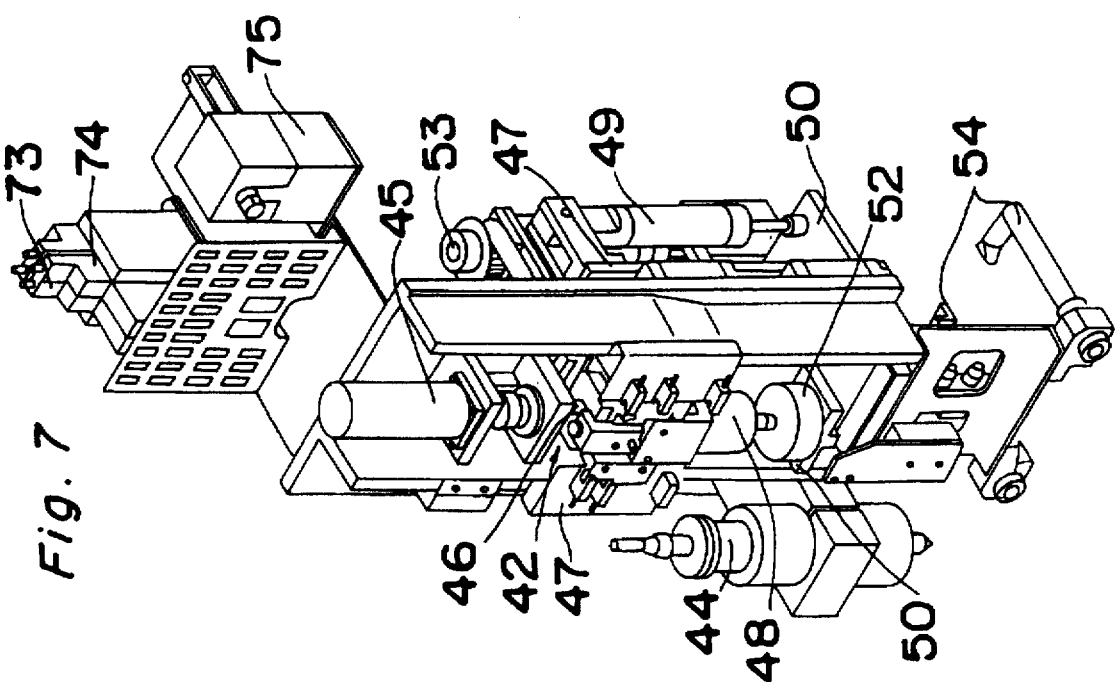
FIG. 7 is a perspective view showing a mounting head according to the embodiment of the present invention.

Referring to FIGS. 2 and 7, the mounting head 5 comprises the tool 41 for sucking the IC component; a pressurizing mechanism 42 for moving the tool 41 vertically; a circuit board-recognizing camera 43 for recognizing the image of the reference position of the circuit board or an IC component-mounting position of the circuit board; and an adhesive agent-applying dispenser 44. As schematically shown in FIG. 8, the pressurizing mechanism 42 comprises a pressurizing cylinder 48 and a dead load compensation cylinder 49 both installed on an elevation frame 47 which is to be driven by a feed screw mechanism 46 which is to be driven by an elevation motor 45; an elevation member 50 vertically movably supported by the pressurizing cylinder 48 and the dead load compensation cylinder 49; and a tool mounting unit 51 installed on the elevation member 50 such that the mounting unit 51 is rotatable around a vertical axis. A pressurizing force detection sensor 52 comprising a load cell is interposed between the pressurizing cylinder 48 and the elevation member 50, thus feedback-controlling the pressure of the pressurizing cylinder 48, depending on a detected pressure so as to apply a desired pressure to the tool 41. The mounting head 5 further comprises a rotation means 53 (see FIG. 7) for positioning the tool mounting unit 51 at a required rotational position; and cold air blow nozzle 54 for cooling the IC component-mounting position of the circuit board by blowing cold air thereto.

Figure 9B:
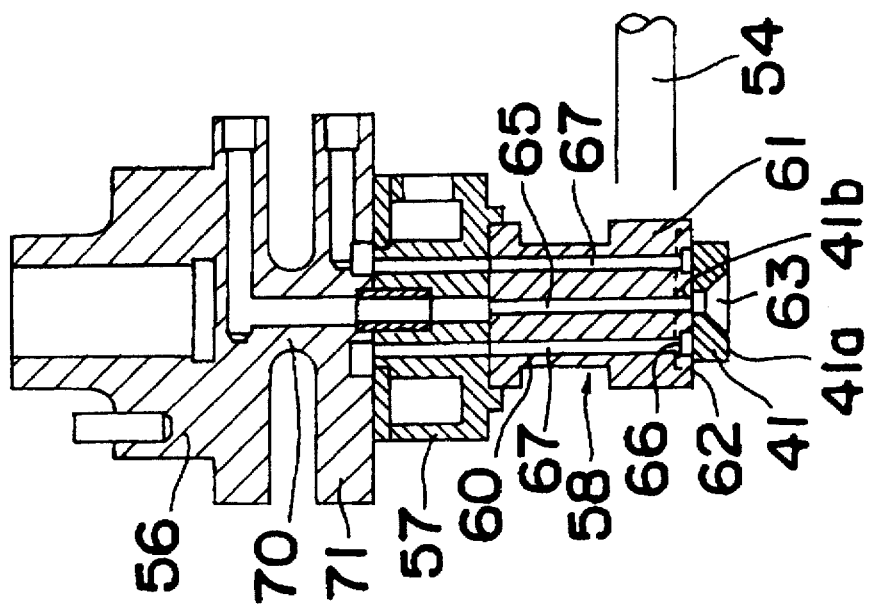
FIG. 9B is a side view partly in vertical section showing the tool-installing unit according to the embodiment of the present invention.
Figure 9A:
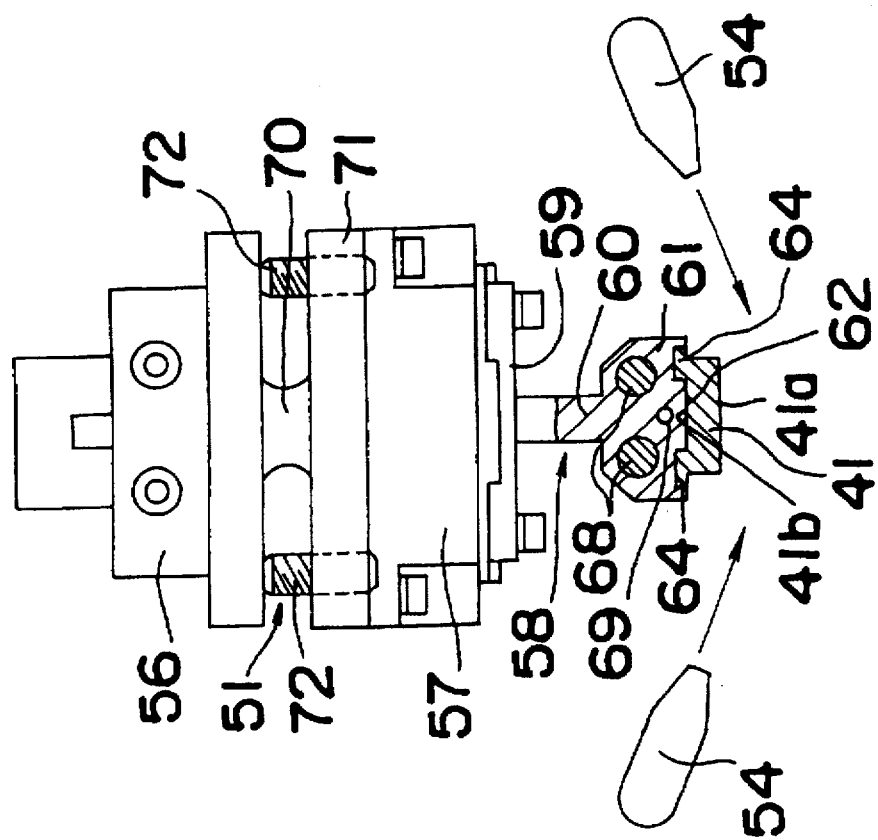
FIG. 9A is a front view partly in section showing a tool-installing unit according to the embodiment of the present invention.

Referring to FIGS. 9A and 9B, the tool mounting unit 51 comprises a mounting member 56 to be engagedly fixed to the lower end of a mounting shaft 55 (see FIG. 8) to be rotated by the rotation means 53; a cooling jacket 57 mounted below the mounting member 56; and a tool-installing member 58 installed below the cooling jacket 57. The tool-installing member 58 comprises a cooling jacket-mounting plate 59; a heat transmission regulation portion 60, having a small sectional area, installed on the lower end of the cooling jacket-mounting plate 59; and a tool-installing portion 61 mounted at the lower end of the heat transmission regulation portion 60.

A tool contact face 62 is formed on the lower surface of the tool-installing portion 61. The tool 41 has a configuration corresponding to that of each IC component and is removably sucked to the tool contact face 62.

The tool 41 is constituted by a flat member having a mounting face 41b parallel with an IC component-sucking face 41a and has a sucking hole 63 in the center thereof. A regulation engaging portion 64 for regulating the position of the tool 41 is provided at each side of the mounting face 41b. A component-sucking path 65 communicating with the sucking hole 63 penetrates through the tool-installing member 58 and the cooling jacket 57, thus having an opening in the periphery of the mounting member 56. A tool sucking path 67 having each tool sucking hole 66 formed on each side of the sucking path 65 has an opening on the tool contact face 62 and penetrates through the mounting member 58 and the cooling jacket 57, thus having an opening in the periphery of the mounting member 56. A heater 68 and a temperature detection means 69 such as a thermocouple are installed on the tool-installing portion 61. A narrow shaft portion 70 is formed on the mounting member 56, so that the parallel degree of the IC component-sucking face 41a of the tool 41 with respect to the circuit board-setting table 3 can be adjusted by a plurality of adjusting screws 72 engaging the periphery of an adjusting plate 71 positioned below the narrow shaft portion 70. Referring to FIG. 7, the mounting head 5 further comprises a tool sucking-vacuum ejector 73; an IC component-sucking vacuum ejector 74; and an air pressure regulator 75.

Figure 10:
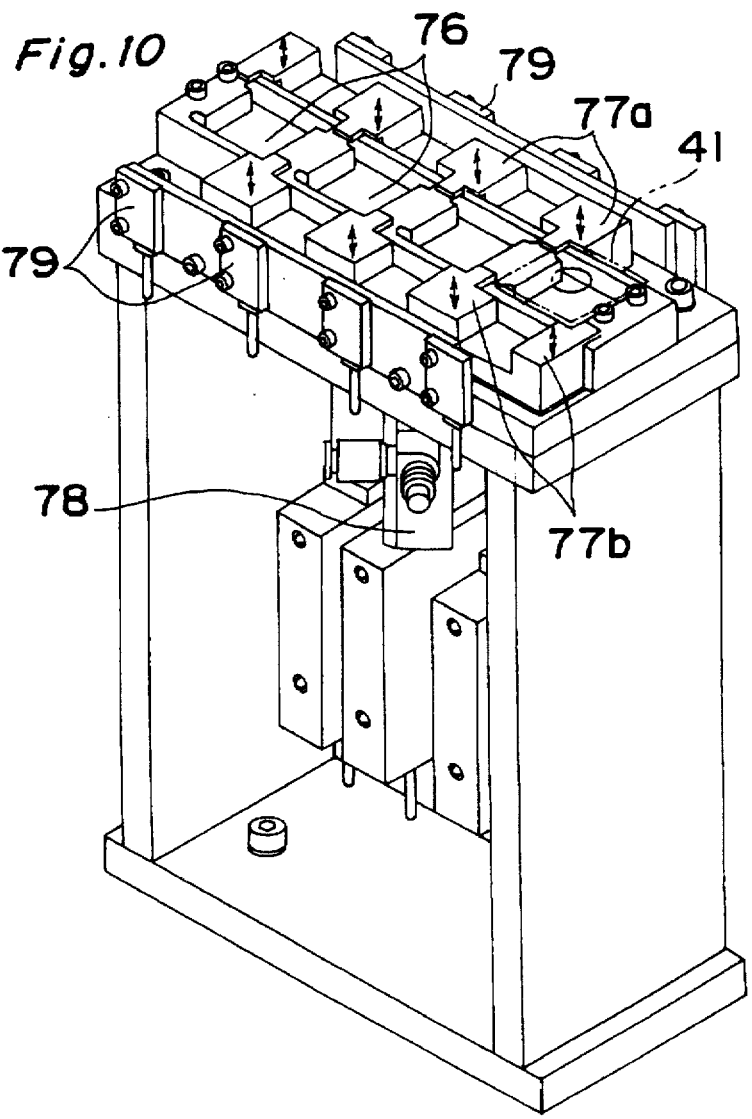
FIG. 10 is a perspective view showing a tool changer according to the embodiment of the present invention.

As shown in FIG. 10, the tool changer 9 comprises a plurality of tool-placing portions 76 for supporting the tools 41 placed thereon; a plurality of pairs of sandwiching members 77a and 77b for sandwiching corners of the tool 41 opposed to each other diagonally and placed at each tool-placing portion 76; an opening/closing driving means 78 for opening and closing all the sandwiching members 77a and 77b together in the directions shown by arrows of FIG. 10; and a plurality of detection means 79 each for detecting whether or not the tool 41 has been placed on the corresponding tool-placing portion 76.

Figure 11:
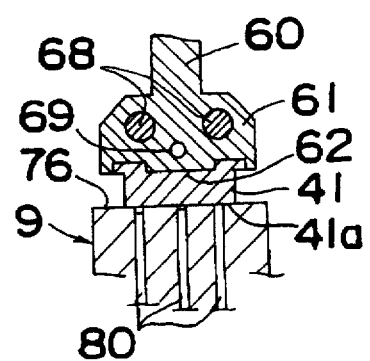
FIG. 11 is a vertical sectional view showing a temperature detection means of a tool-sucking face of the tool changer according to the embodiment of the present invention.

Referring to FIG. 11, a plurality of temperature detection means 80 is provided on the bottom surface of the tool-placing portion 76 of the tool changer 9. The temperature detection means 80 detect the actual temperature of the IC component-sucking face 41a and its temperature distribution thereof measured when the tool 41 is heated by the heater 68 of the tool-installing portion 61. The relationship is found in advance between the temperature of the tool-installing portion 61 detected by the temperature detection means 69 and the temperature of the IC component-sucking face 41a detected by the temperature detection means 80. The temperature of the IC component-sucking face 41a is set to a predetermined temperature accurately by controlling the heater 68 based on the temperature detected by the temperature detection means 69 and the relationship.

Figure 12:
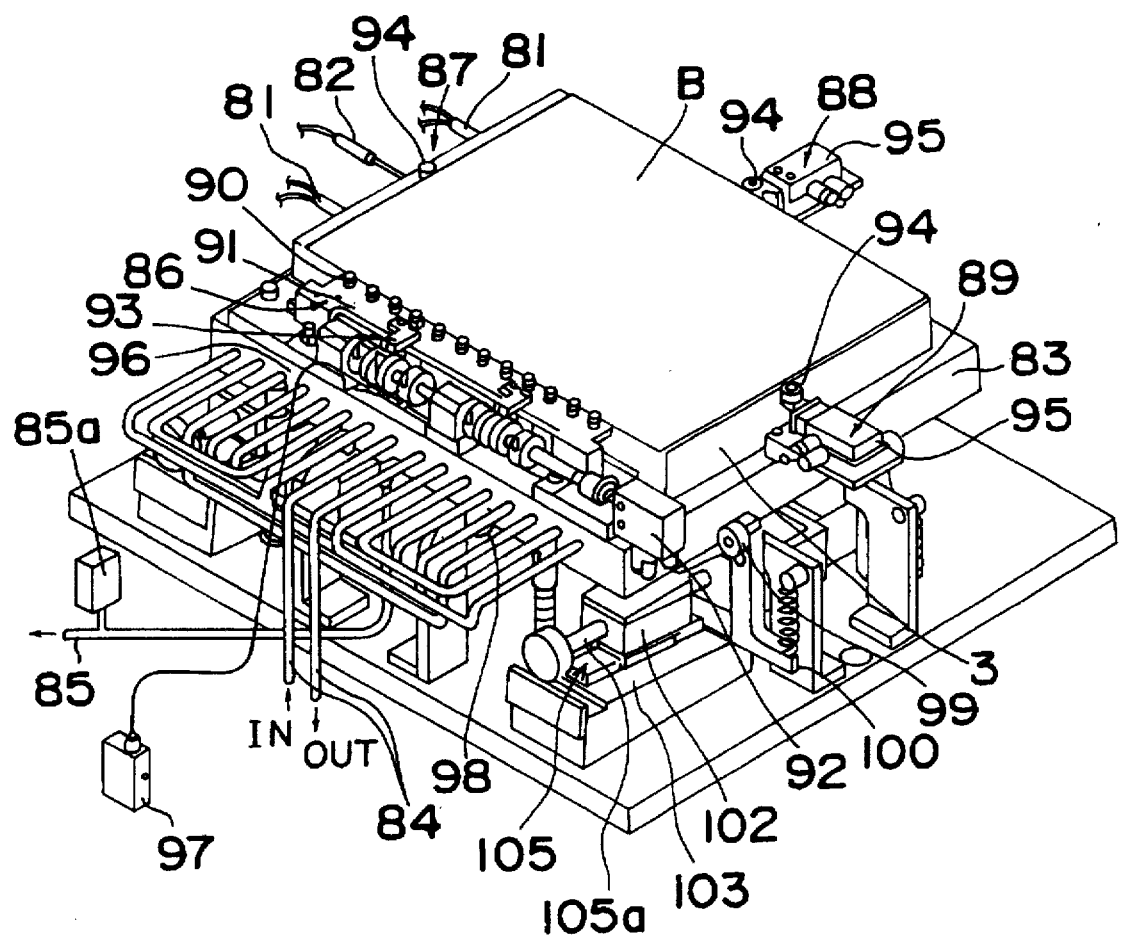
FIG. 12 is a perspective view showing a circuit board-setting table according to the embodiment of the present invention.

Referring to FIG. 12, the circuit board-setting table 3 comprises a heater 81; a temperature detection means 82; and a supporting table 83 incorporating a cooling water pipe 84 for preventing heat from the heater 81 from being transmitted to portions other than the circuit board-setting table 3, a pipe 85 for sucking operation, and a switch 85a for sucking. In this construction, the circuit board-setting table 3 sucks the circuit board, thus holding it thereon, and the temperature of the circuit board is adjusted to a desired one by the heater 81 and the temperature detection means 82 incorporated therein. There are provided, on the supporting table 83, first and second reference side-regulation means 86 and 87 each engaging one of two adjacent sides of the rectangular circuit board placed on the circuit board-setting table 3. There are also provided, on the supporting table 83, movable side-regulation means 88 and 89 for pressing the remaining two adjacent sides of the circuit board toward the first and second reference side-regulation means 86 and 87, thus regulating the position of the circuit board. In order for the first reference side-regulation means 86 to engage the entirety of one side of the circuit board, the first reference side-regulation means 86 is so constructed that a cylinder 92 moves a regulation member 91, on which a plurality of regulation rollers 90 is arranged in parallel with each other, between the regulation position and the unregulated position via a lever interlocking mechanism 93. The second reference side-regulation means 87 and the movable-side-regulation means 88 and 89 are so constructed that each cylinder 95 presses each regulation roller 94 against the corresponding side edge of the circuit board and instead moves each regulation roller 94 backward therefrom. The cylinder 95 of the second reference side-regulation means 87 is pressed against the corresponding side edge of the circuit board at a greater force than those of the movable side-regulation means 88 and 89. The regulation means 86 through 89 regulate the position of the circuit board at a predetermined position on the circuit board-setting table 3 and does not regulate the position thereof when heating is performed to mount the IC component on the circuit board, while sucking the circuit board. The circuit board-setting table 3 is provided with a sensor 96 for detecting the circuit board placed thereon and an amplifier 97 for the sensor 96.

Figure 13:
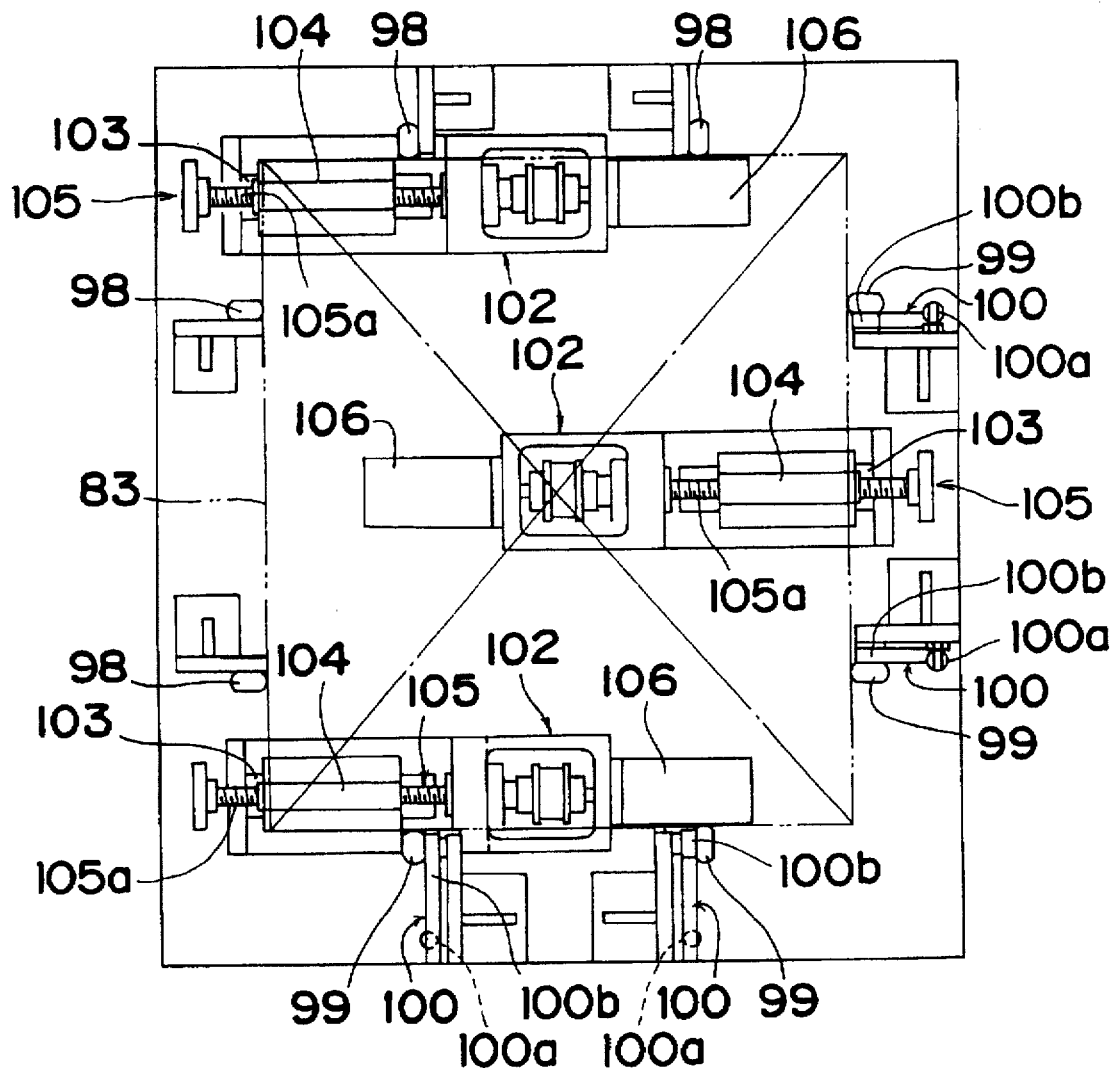
FIG. 13 is a plan view showing an adjusting means for adjusting the inclination of the circuit board-setting table according to the embodiment of the present invention.
Figure 14:
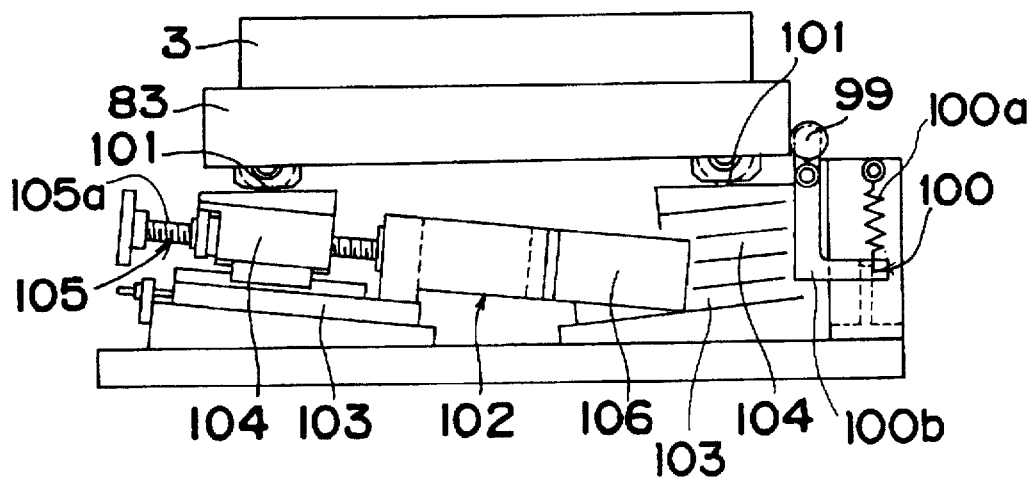
FIG. 14 is a side view showing the adjusting means for adjusting the inclination of the circuit board-setting table according to the embodiment of the present invention.

Referring to FIGS. 13 and 14, the supporting table 83 is supported by a pair of fixing guide rollers 98 engaging the two end faces, adjacent to each other, of the four side end faces thereof and a pair of pressing guide rollers 99 engaging the remaining two adjacent side end faces thereof, such that the supporting table 83 can be moved vertically and inclined to a slight extent. Each pressing guide roller 99 is pressed by a pressing mechanism 100 comprising a spring 100a and a lever 100b. Two supporting rollers 101 and one supporting roller 101 are installed on the underside of the supporting table 83 at both ends of one side thereof and at the center of the other side thereof, respectively. A height adjusting means 102 dedicated to the adjustment of the height of each of the three supporting points is installed, for each supporting roller 101, on the underside of the supporting table 83. The height adjusting means 102 comprises a movable wedge-shaped member 104 movable along an inclined guide 103 and having a horizontal upper surface where the supporting roller 101 rotates; a feed screw mechanism 105 for back and forth moving the wedge-shaped member 104; and a driving motor 106 for rotating the feed screw 105a of the feed screw mechanism 105. In this manner, the height adjusting means 102 adjusts the height of both ends of one side of the supporting table 83 and the center of the other side thereof, thus adjusting the inclination of the supporting table 83 at a given portion thereof without changing the height of the given portion.

Figure 15:
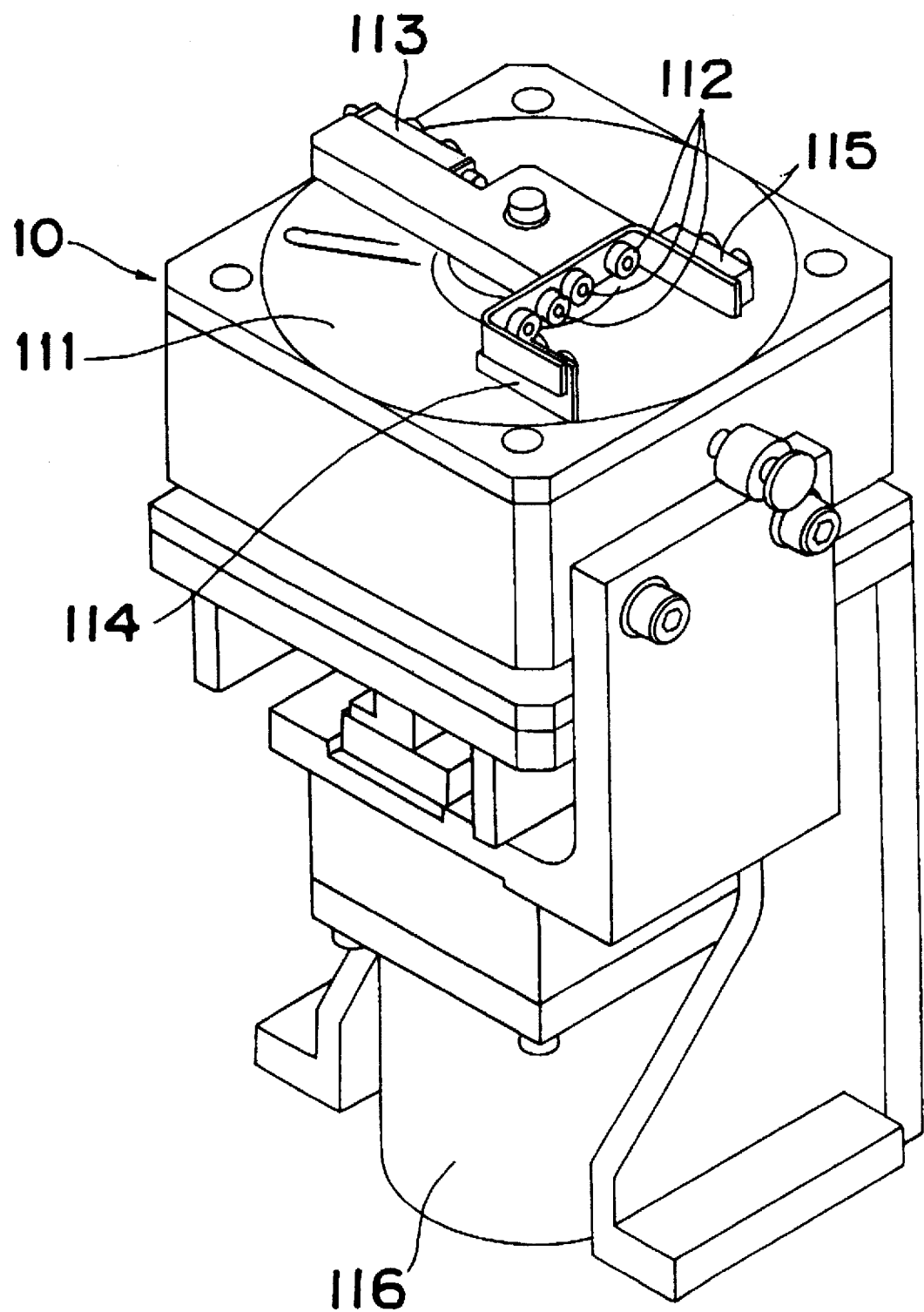
FIG. 15 is a perspective view showing a transfer means according to the embodiment of the present invention.

Referring to FIG. 15, in the transfer means 10, electrode-bonding silver paste is supplied to a transfer plate 111 from a supply nozzle 112, and a plurality of squeegees 113, 114, and 115 are rotated by a driving motor 116 so as to form a uniform thin film of the silver paste on the transfer plate 111. The silver paste is transferred and attached to the bump of the IC component by pressing the IC component against the transfer plate 111 slightly.

Figure 16:
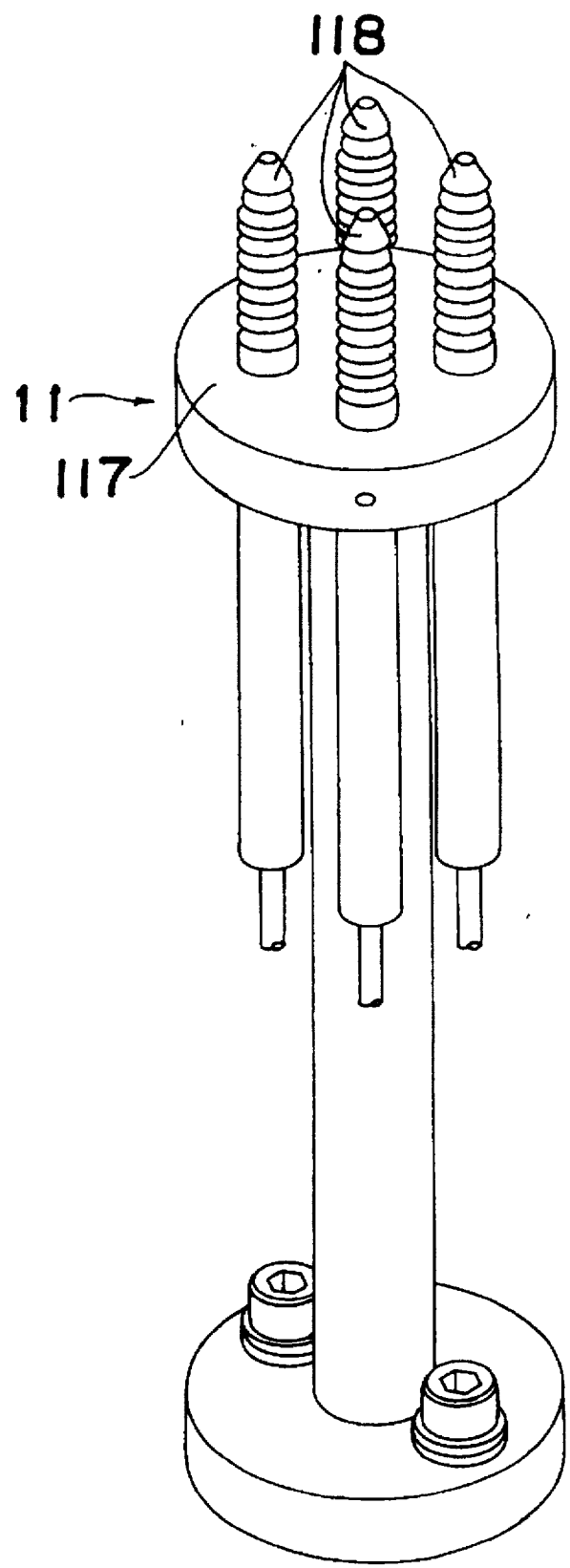
FIG. 16 is a perspective view showing a means for detecting the parallel degree of a tool according to the embodiment of the present invention.
Figure 17:
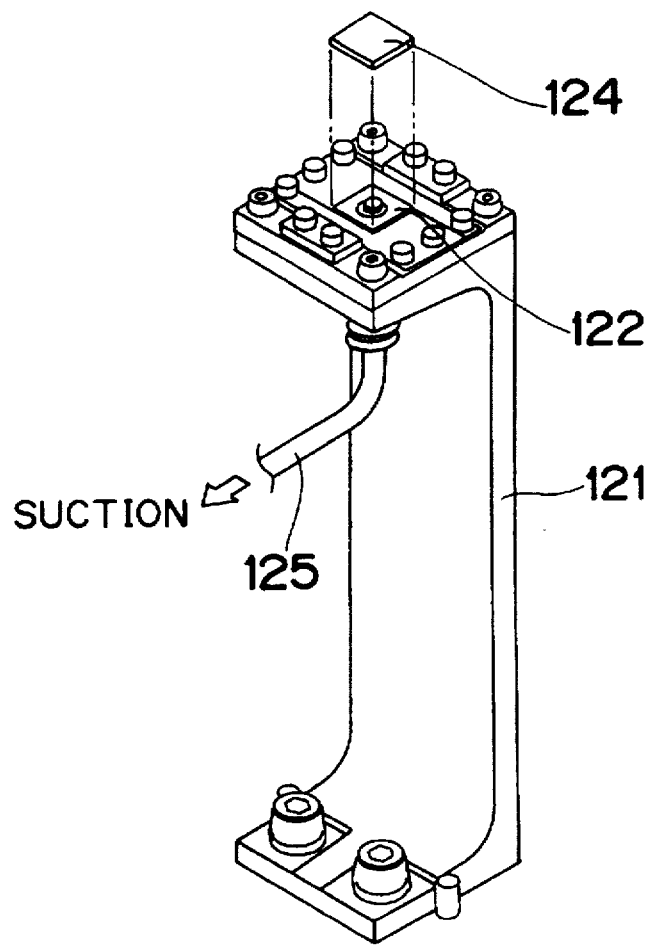
FIG. 17 is a perspective view showing a dislocation detection means according to the embodiment of the present invention.

Referring to FIG. 16, the means 11 for detecting the parallel degree of the tool 41 comprises a horizontal mounting plate 117 and four level gauges 118 vertically mounted thereon. The inclination of the IC component-sucking face 41a of the IC component of the tool 41 with respect to the horizontal reference plane can be detected by pressing the four corners of a measuring plate against the level gauges 118, with the measuring plate being held by the tool 41. The adjusting screws 72 of the tool-installing member 58 are adjusted according to a detected inclination of the IC component-sucking face 41a so as to allow the IC component-sucking face 41a to be coincident with the horizontal reference plane.

Figure 18A:
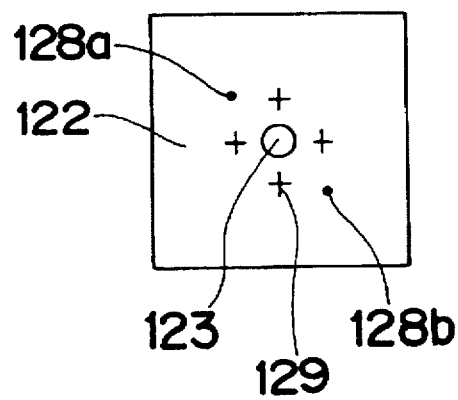
FIG. 18A is a plan view showing a lower jig plate of the dislocation detection means according to the embodiment of the present invention.
Figure 18B:
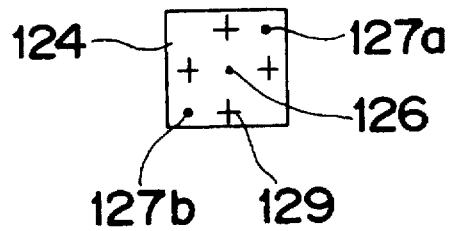
FIG. 18B is a bottom view showing an upper jig plate of the dislocation detection means according to the embodiment of the present invention.
Figure 19A:
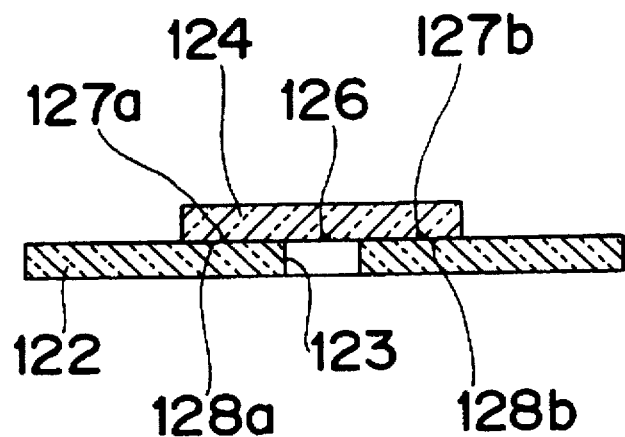
FIG. 19A is a vertical sectional view showing a state in which the upper jig plate of the dislocation detection means has been placed on the lower jig plate according to the embodiment of the present invention.
Figure 19B:
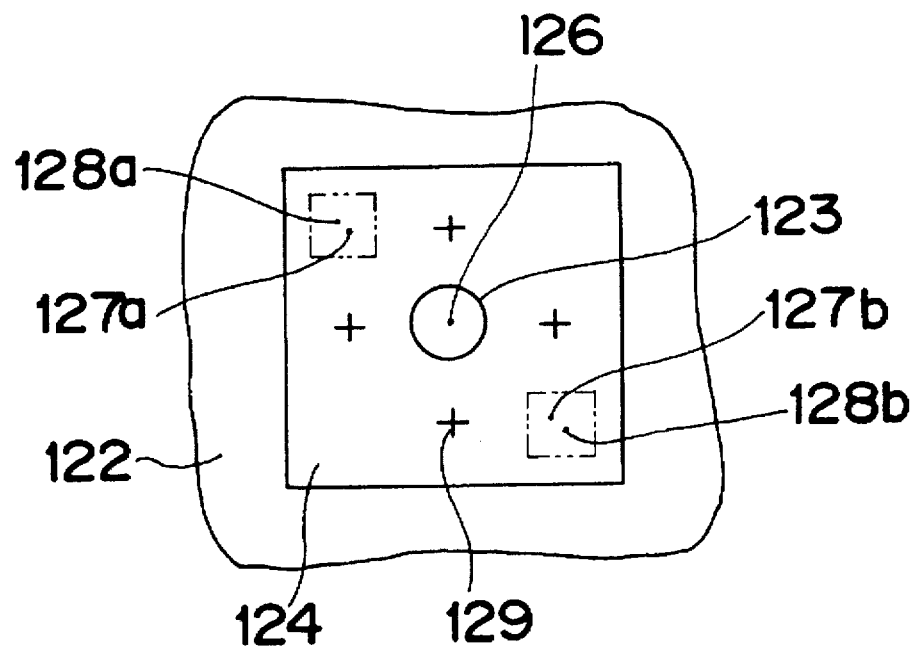
FIG. 19B is a plan view showing a state in which the upper jig plate of the dislocation detection means has been placed on the lower jig plate according to the embodiment of the present invention.

Referring to FIGS. 17, 18A, 18B, 19A, and 19B, the dislocation-detection means 12 comprises a supporting member 121; a lower jig plate 122, made of a transparent glass plate, fixed to the upper surface of the supporting member 121 and having a sucking hole 123 formed in the center thereof; and an upper jig plate 124, made of a transparent glass plate, placed on the lower jig plate 122. The sucking hole 123 communicates with an evacuation means 125, thus sucking the upper jig plate 124 placed on the lower jig plate 122 thereto and thus fixing the upper jig plate 124 to the lower jig plate 122. The lower jig plate 122 indicates an imaginary IC component-mounting position, and the upper jig plate 124 shows an imaginary IC component to be mounted on the mounting position. As shown in FIG. 18B, a center mark 126 and a pair of dislocation detection marks 127a and 127b are formed on the lower surface of the upper jig plate 124. More specifically, the center mark 126 is formed at the center of the lower surface of the upper jig plate 124, and the dislocation detection marks 127a and 127b are formed on a diagonal line of the upper jig plate 124. As shown in FIG. 18A, a pair of dislocation detection marks 128a and 128b is formed on the upper surface of the lower jig plate 122 such that the dislocation detection marks 128a and 128b are formed on a diagonal line of the lower jig plate 122 and that the dislocation detection marks 128a and 128b are positioned outward of the dislocation detection marks 127a and 127b along the diagonal line. That is, when the upper jig plate 124 is overlaid on the lower jig plate 122 in a normal position relationship, the center mark 126, the dislocation detection marks 127a, 127b, 128a, and 128b are arranged as shown in FIGS. 19A and 19B. Both the upper jig plate 124 and the lower jig plate 122 have marks 129 to be used to visually check whether or not the former has been overlaid on the latter appropriately.

Figure 20:
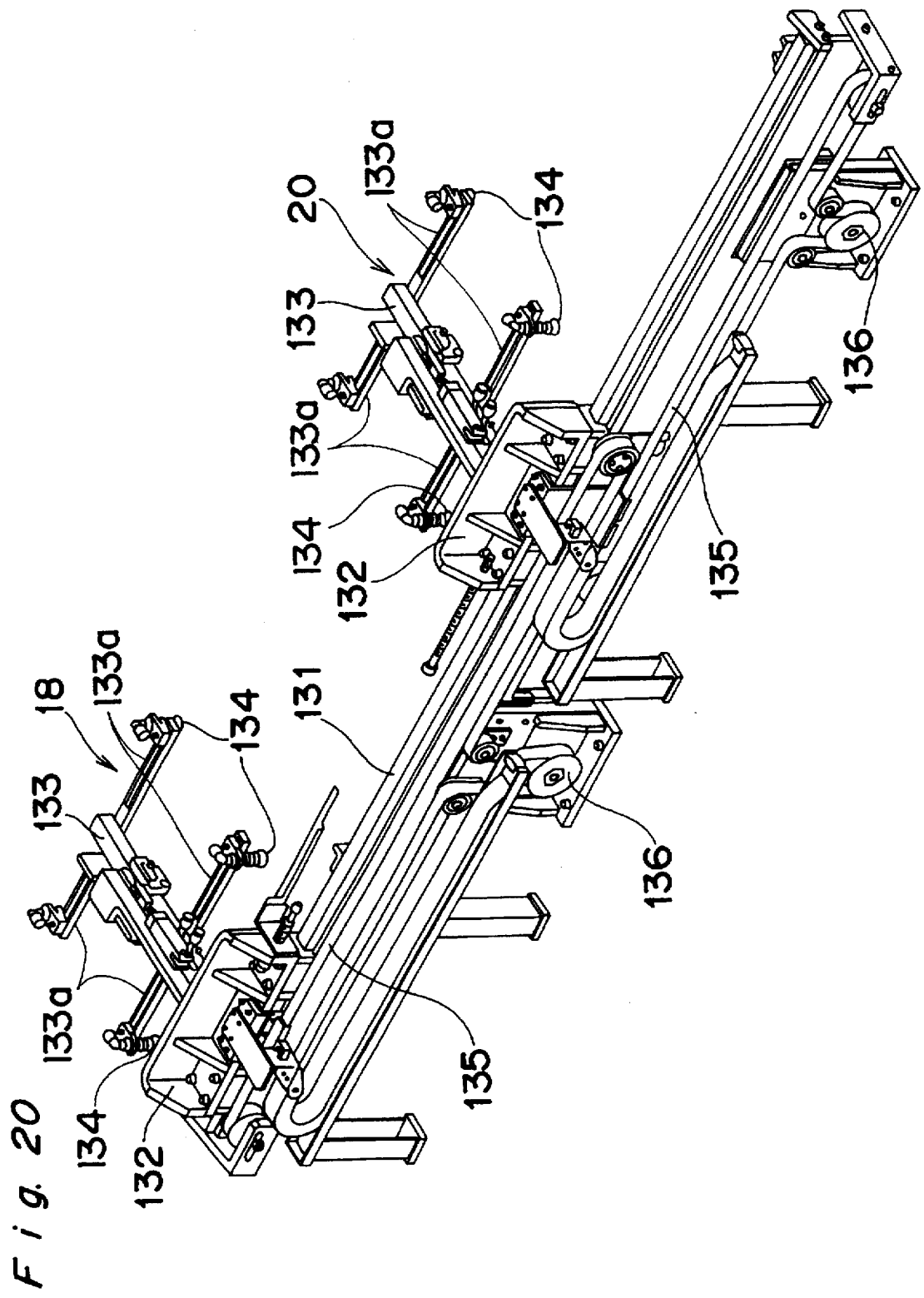
FIG. 20 is a perspective view showing a feed-in/movable means and a feed-out/movable means according to the embodiment of the present invention.

The feed-in/movable means 18 and the feed-out/movable means 20 have substantially the same construction. That is, as shown in FIG. 20, a supporting arm 133 extends from a movable member 132 movable along a common rail 131. A sucking pad 134 is installed on each end, of a branch arm 133a of the supporting arm 133, corresponding to each of the four corners of the circuit board. The movable member 132 is moved by an endless driving belt 135 provided along the moving path of the movable member 132. The endless driving belt 135 is driven by a driving pulley 136.

Figure 30A:
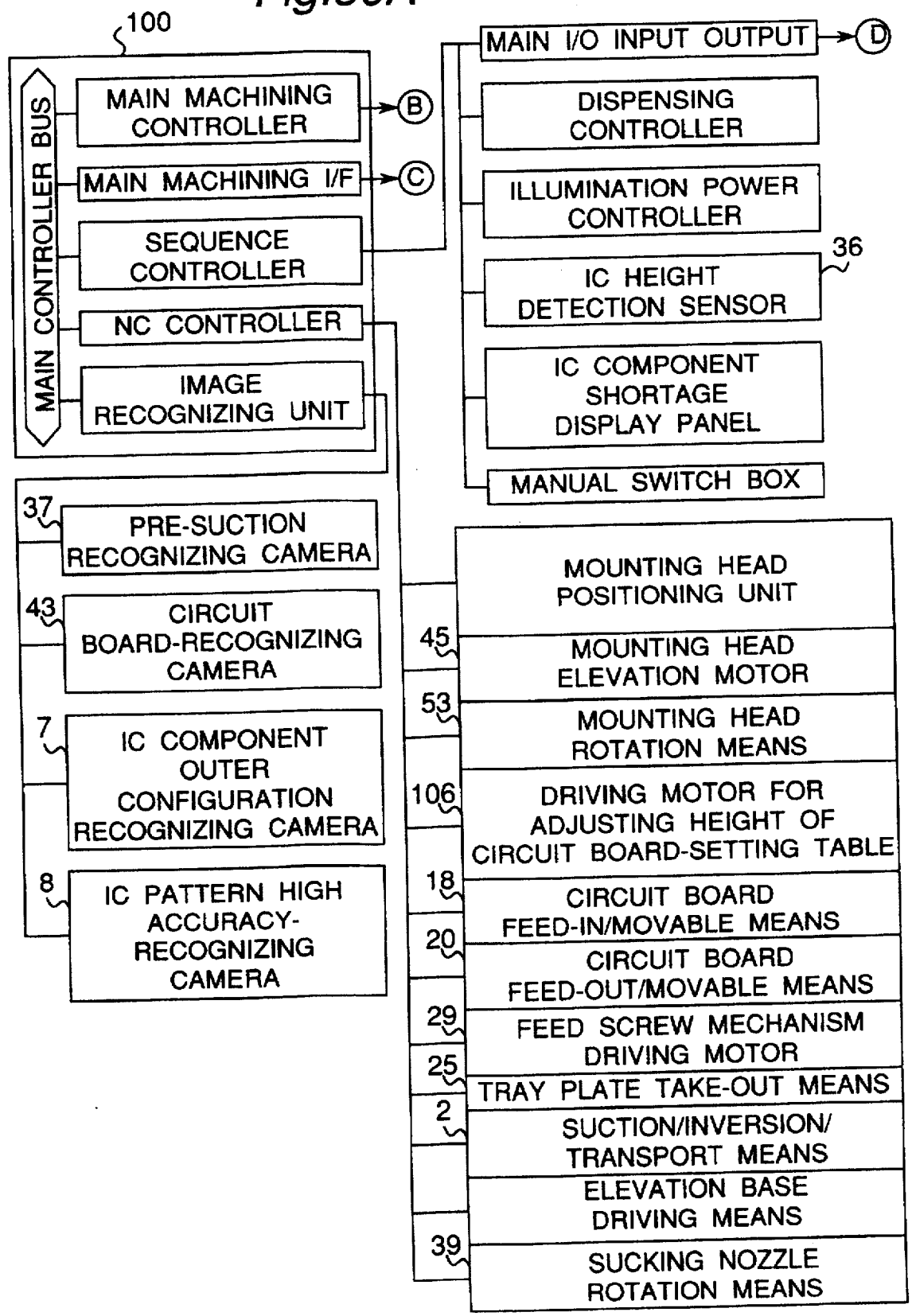
FIGS. 30A and 30B are a block diagram showing a control part of the apparatus according to the embodiment of the present invention to carry out the method according to the embodiment.
Figure 30B:
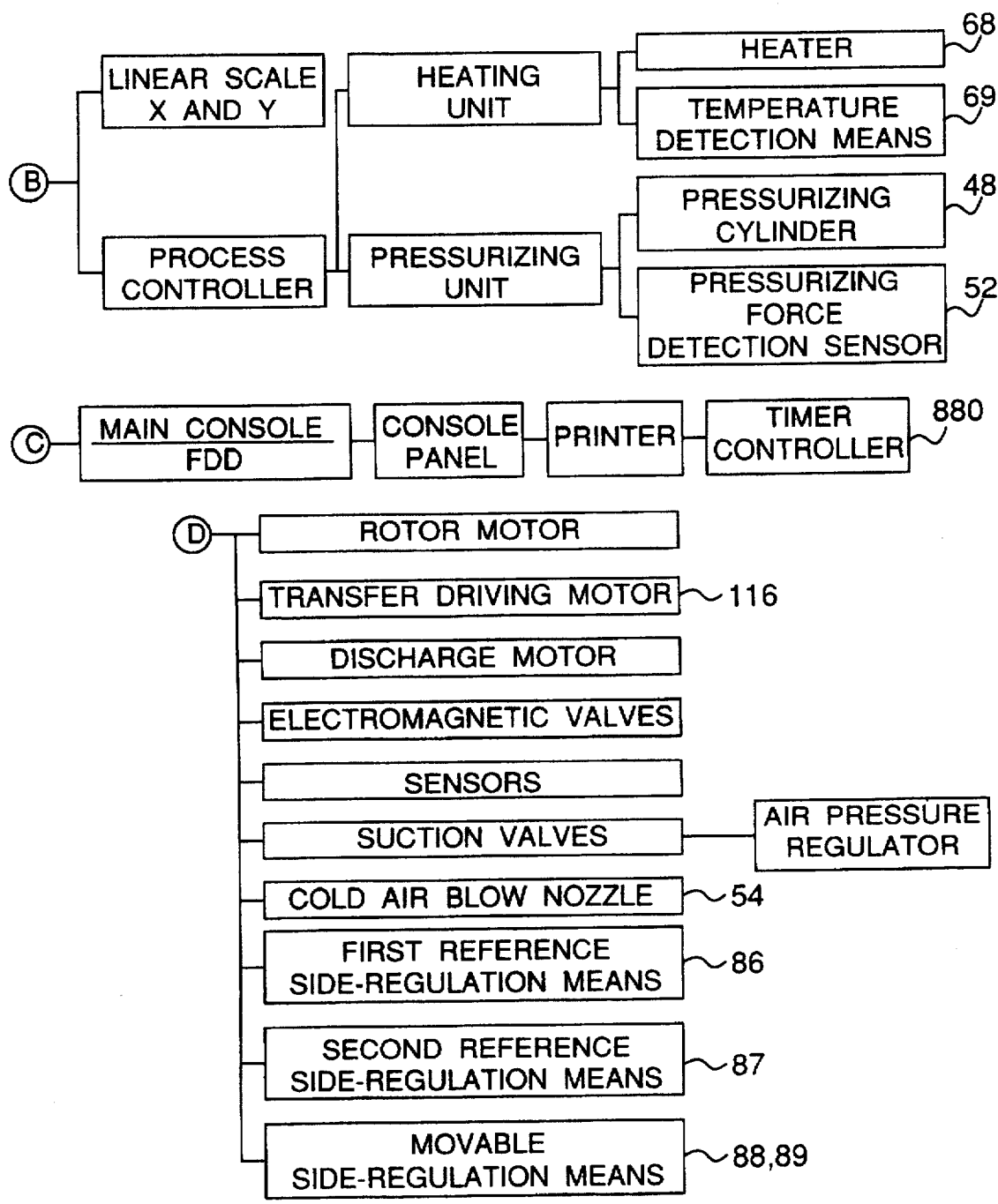

The above-described means and members are controlled by a control part shown in FIGS. 30A and 30B to carry out the operations described above and below.

The mounting operation for mounting the IC component to be performed by the IC component mounting apparatus having the above-described construction is described below with reference to a flowchart shown in FIGS. 1A and 1B mainly and FIGS. 2 through 26. In this embodiment, an IC component (P) consisting of a flip chip IC is mounted on a multilayer board (B), as shown in FIG. 24. That is, a bump (b) serving as a bonding electrode is provided on each of a plurality of surface electrodes (t) formed on a side face of the IC component (P); and the bump (b) is bonded to an electrode (d) of the multilayer board (B) with a bonding metal (m) consisting of silver paste; and thermosetting adhesive agent (r) is charged between the IC component (P) and the multilayer board (B) so as to seal the gap therebetween and bond them to each other.

Figure 25:
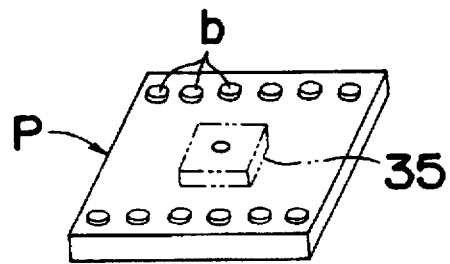
FIG. 25 is a perspective view showing the state shown in FIG. 24.

In this case, the IC component (P) is supplied to the supply position by turning the bump-provided face upward, namely, in the face-up state as shown in FIG. 25 so as to prevent the bumps (b) from being damaged during the transport from a manufacturing factory to a mounting factory. Therefore, in taking the IC component (P) from the tray 21, it is necessary for the sucking nozzle 35 to suck the IC component (P) by placing the sucking nozzle 35 at a position at which the sucking nozzle 35 does not interfere with the bumps (b), as shown by two-dot chain lines of FIG. 25.

Figure 26:
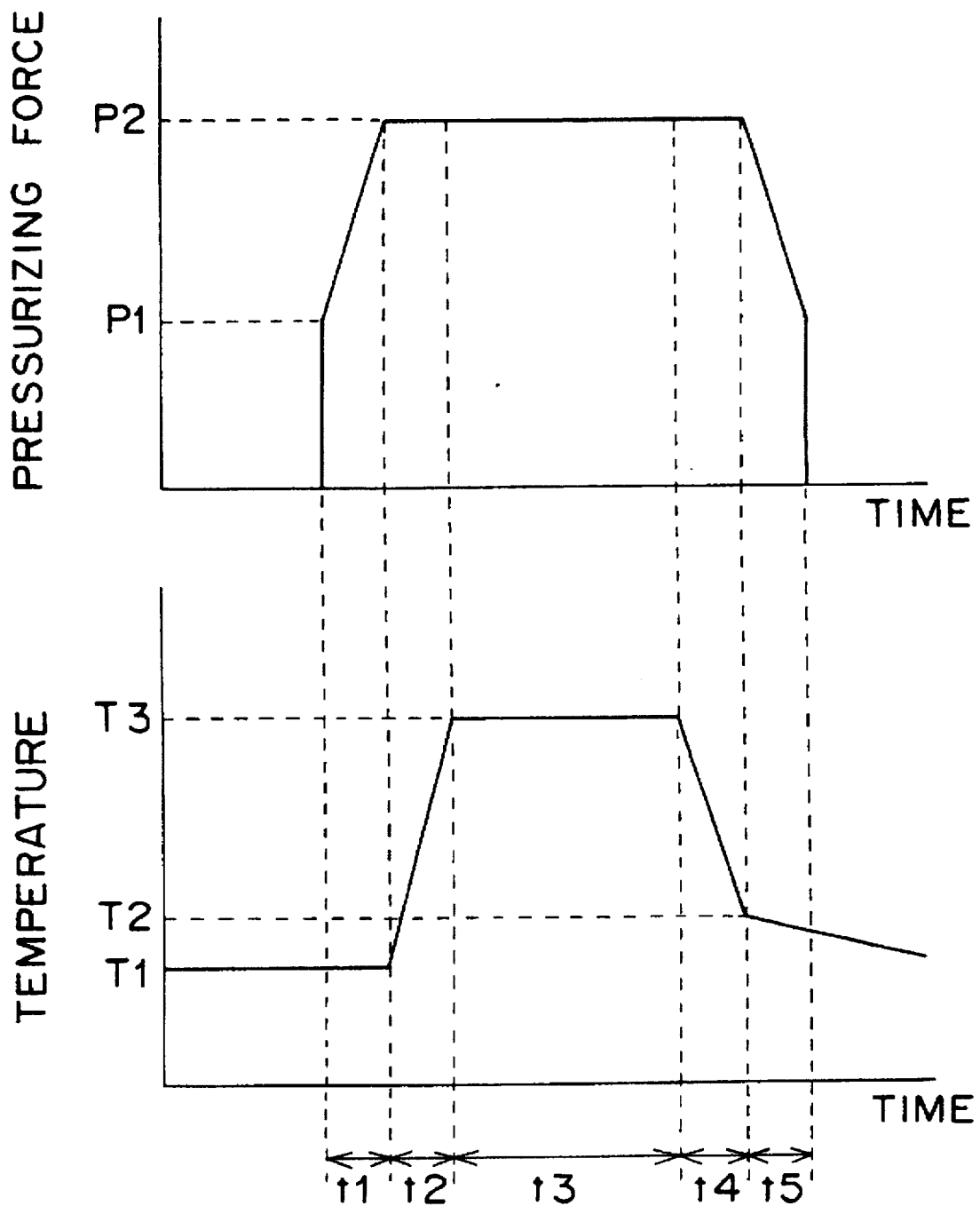
FIG. 26 is an explanatory view showing a profile based on which pressurization and heating are carried out in mounting the IC component on the circuit board.

In this embodiment, in order to supply the IC component (P) to the circuit board (B) and mount the IC component (P) thereon, it is necessary to pressurize and heat the IC component (P) based on a predetermined profile as shown in FIG. 26. That is, after applying an initial pressure P1 to the IC component (P), the IC component (P) is pressurized for a time period t1 until the pressure becomes P2. Then, temperature is increased gradually from T1 to T3 for a time period of t2 with the pressure P2 maintained. The pressure P2 and the temperature T3 are maintained for a time period of t3. Then, the temperature is dropped from T3 to T2 during a time period of t4. Then, the pressure is reduced from the pressure P2 to the initial pressure P1 during a time period of t5 so as to stop the pressurization of the IC component (P).

Figure 1B:
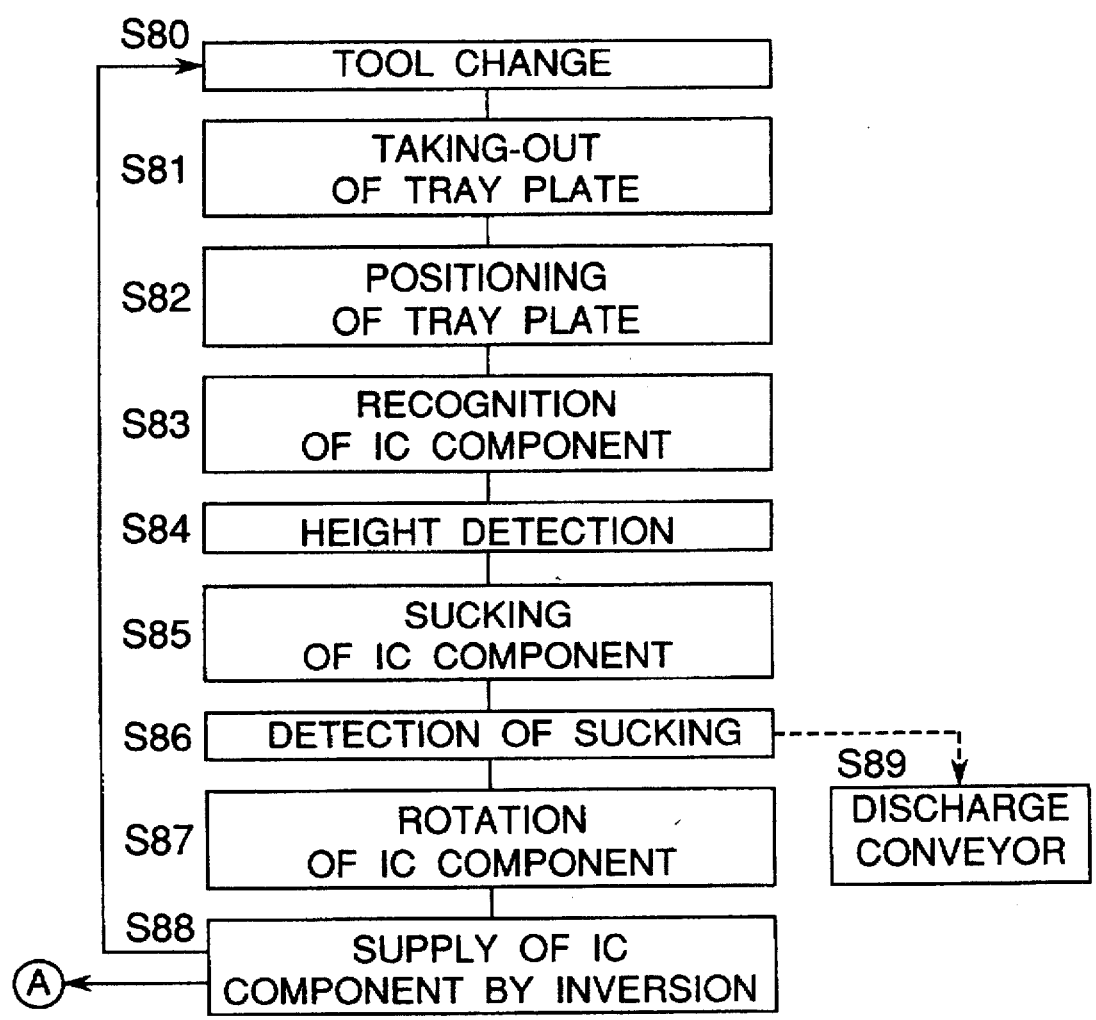

Referring to FIGS. 1A and 1B, the feed-in operation and the feed-out operation of the circuit board (B) are described below through steps S50–S55 and S73–75. The circuit board (B) is transported at step S50 to the circuit board preheating means 17 by the feed-in conveyor 16 to preheat the circuit board (B) at step S51. When the mounting of the IC component (P) on the circuit board (B) previously placed on the circuit board-setting table 3 is completed through steps S58–71 and 80–88, the operation of sucking the mounted circuit board (B) by the circuit board-setting table 3 is terminated at step S73. Then, the circuit board (B) placed on the circuit board preheating means 17 and preheated at step S51 is transferred to the circuit board-setting table 3 by the feed-in/movable means 18 at step S52 and at the same time, the mounted circuit board (B) is transferred to the feed-out conveyor 19 by the feed-out/movable means 20 and then fed out at step S75. The circuit board (B) transferred to the circuit board-setting table 3 is placed in position by the reference side-regulation means 86 and 87 and the movable side-regulation means 88 and 89 which have moved to each regulation position at step S53, and then, sucked by the circuit board-setting table 3 and fixedly held thereon at step S54. The circuit board-setting table 3 is heated by the heater 81 while the temperature of the circuit board (B) is detected by the temperature detection means 82 at step S55. In this manner, the circuit board (B) is kept at a predetermined temperature. In the heating step at step S55, if the circuit board (B) is regulated in position by the reference side-regulation means 86 and 87 and the movable side-regulation means 88 and 89, the circuit board (B) may be dislocated on the circuit board-setting table 3 because of thermal expansion of the circuit board (B). Then, in order to remove such a disadvantage, when the heating step at S55 is performed, it is preferable that the circuit board (B) is not regulated in position by the reference side-regulation means 86 and 87 and the movable side-regulation means 88 and 89 while the circuit board (B) is sucked by the circuit board-setting table 3 and fixedly held thereon at step S56.

Next, the operation for supplying the IC component (P) to the mounting head 5 is described below through steps S81–89. In the IC component supply means 1, the lifter 24 is actuated to place, at a predetermined height, the tray plate 22 accommodating the IC component (P) to be mounted subsequently on the circuit board (B) Then, the tray plate 22 is taken out from the magazine 23 by the take-out means 25 at step S81 and placed in position so that the IC component (P) is placed at the supply position on the movement path of the sucking nozzle 35 at step S82.

Figure 21A:
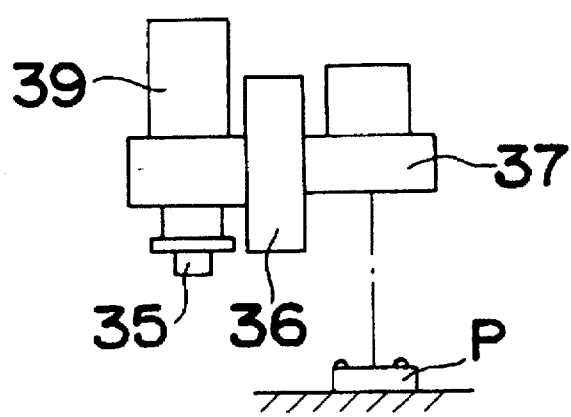
FIGS. 21A, 21B, and 21C are explanatory views showing a process of sucking the IC component at a supply position according to the embodiment of the present invention.
Figure 21B:
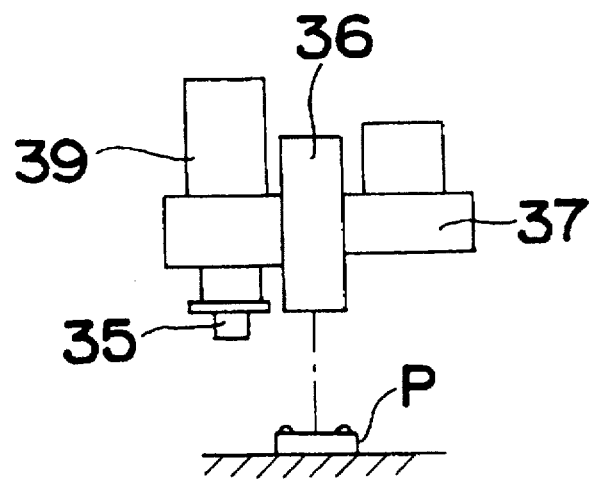
Figure 21C:
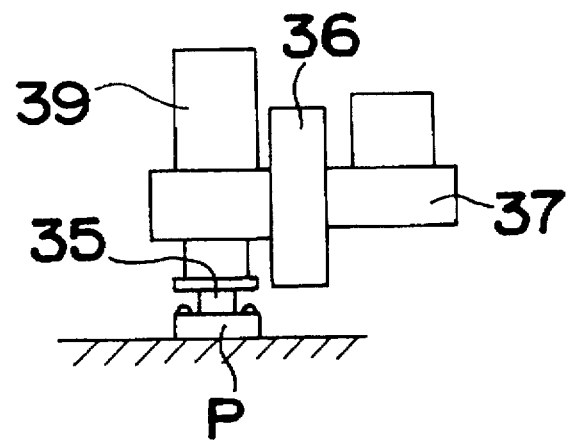

Then, the movable member 32 of the suction/inversion/transport means 2 is moved to the supply position so that the sucking nozzle 35 sucks the IC component (P) thereto. At this time, in order for the sucking nozzle 35 to suck the IC component (P) appropriately as shown in FIG. 25, the recognizing camera 37 is located above the IC component (P), as shown in FIG. 21A, so that the recognizing camera 37 detects the position of the IC component (P) correctly at step S83. The position of the tray plate 22 is corrected by the take-out means 25 based on the detected result, and corrections are made for the movement amount of the height detection sensor 36 and that of the sucking nozzle 35 in placing them above the IC component (P). Then, as shown in FIG. 21B, the height of the sucking position of the IC component (P) is detected by the height detection sensor 36 at step S84 and then, the sucking nozzle 35 is placed directly above the IC component (P). Thereafter, as shown in FIG. 21C, the sucking nozzle 35 is moved downward to a position at which a slight gap, for example, 5/100 mm is present between the IC component (P) and the sucking nozzle 35. In this state, the IC component (P) is sucked to the sucking nozzle 35 at step S85. The control over the downward position of the sucking nozzle 35 eliminates a possibility that the sucking nozzle 35 strongly collides with the upper face of the IC component (P) and damages its circuit.

If the IC component (P) has been sucked abnormally, the abnormal state is detected by a sucking pressure detected by the sucking unit 38 at step S86. If it is detected at step S86 that the IC component (P) has been sucked abnormally, the movable member 32 is moved to the position of the discharge conveyor 14 so as to discharge the IC component (P) at step S89. Then, the subsequent IC component (P) is supplied to the supply position and sucked to the sucking nozzle 35 at steps S83–85. Then, the sucking nozzle 35 is rotated by a rotation means 39 as necessary to change the rotation posture of the IC component (P) at step S87. Thereafter, the movable member 32 is moved toward the transfer position. As a result, the inversion frame 34 is inverted at step S88 and hence, the sucking nozzle 35 is turned from the face-down posture to the face-up posture at the transfer position. Thus, the mounting head 5 is supplied with the IC component (P) in the face-down posture.

The operation for mounting the IC component (P) on the circuit board (B) is described below through steps S59–72. While the mounting head 5 is being moved toward a subsequent mounting position, the inclination of the circuit board (B) is corrected at step S57 by adjusting, by the adjusting means 102, the heights of the three supporting points of the supporting table 83 on which the circuit board-setting table 3 has been installed, according to the inclination of the mounting position of the circuit board (B) without changing the height of the mounting position. In this manner, the face of the mounting position of the circuit board (B) can be allowed to be parallel with the IC component-sucking face 41a of the tool 41.

That is, in the case of the multilayer board (B), the inclination of the surface of the circuit board (B) is changed, depending on patterns of underlayers. In general, the circuit boards (B) of the same type have the same tendency in inclination. That is, such inclination is not changed greatly between the circuit boards of the same type. Thus, the inclination of the circuit board (B) at each mounting position thereof is measured for each type of apparatus so as to correct the inclination of the circuit board (B) at each mounting position thereof according to the inclination thereof. In this manner, the bumps (b) of each IC component can be bonded appropriately to the electrodes (d) of the circuit board (B). Accordingly, the IC components (P) can be mounted on the circuit board (B) with high reliability.

Figure 22A:
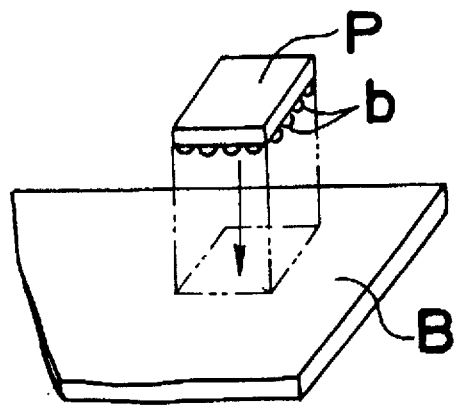
FIGS. 22A, 22B, and 22C are explanatory views showing a process of measuring the inclination of a component-mounting position of a circuit board according to the embodiment of the present invention.
Figure 22B:
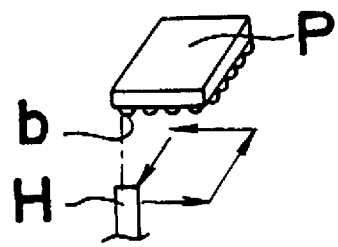
Figure 22C:
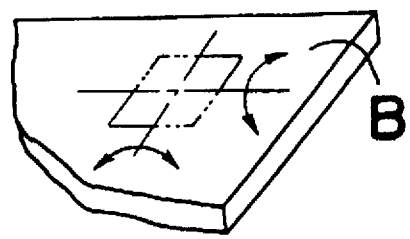

As a method for measuring the inclination of the circuit board (B) at each mounting position thereof, it is conceivable to measure the heights of respective mounting positions thereof directly. But it is difficult to determine the reference point in performing calculations of the respective mounting positions because the surface of the circuit board (B) has a large degree of irregularity. Thus, the heights of the respective mounting positions of the circuit board (B) cannot be measured with high accuracy. Hence, in this embodiment, as shown in FIG. 22A, the bumps (b) are plastically deformed by the electrodes (d) of the circuit board (B) by pressing the IC component (P) or a model thereof against the mounting position of the circuit board (B) while the IC component (p) or the model thereof is being held by the mounting head 5. Then, as shown in FIG. 22B, the height of the bumps (b) of the IC component (P) or those of the model are scanned and measured by a height detection means (H). Based on detected heights, the inclination of the circuit board (B) at the mounting position thereof is calculated and stored. In this manner, the inclinations of respective mounting positions of the circuit boards (B) of various types of apparatuses are stored in a memory of the IC component mounting apparatus. Based on the stored data, the heights of the three supporting points of the supporting table 83 are adjusted as described above at each mounting position of the circuit board (B) in mounting the IC component thereon so as to correct the inclination of the circuit board (B), as shown in FIG. 22C at step S57.

When the mounting head 5 has reached a position directly above the mounting position, the pattern of the mounting position or a mounting positioning mark is recognized by the circuit board-recognizing camera 43 to measure the mounting position accurately at step S59. While the mounting head 5 is being moved toward the transfer position, the tool 41 is rotated by the rotation means 53 in accordance with the rotational posture of the IC component (P) at step S60. When the tool 41 has reached the transfer position, the IC component (P) is sucked by the tool 41 at step S61.

Then, the mounting head 5 is moved to the transfer means 10. Then, the IC component (P) is pressed against the transfer plate 111 so as to transfer the silver paste (m) to the bumps (b) of the IC component (P) at step S62. While the mounting head 5 is being moved toward the component recognizing means 6, the circuit of the heater 68 of the tool-installing portion 61 is energized to heat the tool 41 so as to evaporate organic solvent of the silver paste (m) at step S63. Then, at step S64, cooling air is blown from the cold air blow nozzle 54 to the IC component-mounting position of the circuit board (B) and the tool 41 so as to prevent the silver paste (m) from giving bad influence when the silver paste (m) is embedded in the thermosetting adhesive agent (r) in a subsequent process.

When the mounting head 5 has reached the position of the component recognizing means 6, the IC component (P) held by the tool 41 is placed at the position of the recognizing camera 7 so that the recognizing camera 7 recognizes the configuration of the IC component (P) and the rough sucking position thereof at step S65. If the appropriate IC component (P) has not been held by the tool 41 or the holding posture is inappropriate, the inappropriate IC component (P) is discharged into a discharge box 15 at step S72. If the appropriate IC component (P) is appropriately held by the tool 41, the appropriate IC component (P) is placed at a position in such a manner that a predetermined pattern or a positioning mark comes within the visual field of the recognizing camera 7 according to the position of the IC component (P) roughly detected by the recognizing camera 7. In this manner, the sucking position of the IC component (P) is recognized with high accuracy at step S66.

Then, the mounting head 5 is placed in position such that the dispenser 44 is located directly above the mounting position of the circuit board (B), so that the dispenser 44 applies the thermosetting adhesive agent (r) to the center of the mounting position at step S67.

Then, the IC component (P) is placed directly above the mounting position of the circuit board (B), and the tool 41 is moved downward to mount the IC component (P) on the circuit board (B) such that the gap between the IC component (P) and the circuit board (B) is completely filled with the thermosetting adhesive agent (r) previously applied to the center of the mounting position of the circuit board (B), while the thermosetting adhesive agent (r) is being spread at step S68. In mounting the IC component (P) on the circuit board (B), the data of the mounting position of the mounting head 5 is corrected by the position data of the mounting position of the circuit board (B) recognized by the circuit board-recognizing camera 43 and the position data of the sucked position of the IC component (P) recognized by the recognizing camera 8. In this manner, the IC component (P) is mounted on the mounting position of the circuit board (B) with good accuracy. Then, the pressure of the pressurizing cylinder 48 is detected by the pressurizing force detection sensor 52 in order for the pressurizing cylinder 48 to apply an appropriate pressure to the tool 41 while the feedback control is performed at step S69. At the same time, the temperature of the tool 41 is detected by the temperature detection means 69 in order for the heater 68 to heat the tool 41 while the feedback control is performed at step S70. Based on the profile shown in FIG. 26, the IC component (P) is pressurized and heated to mount the IC component (P) on the circuit board (B).

Figure 23A:
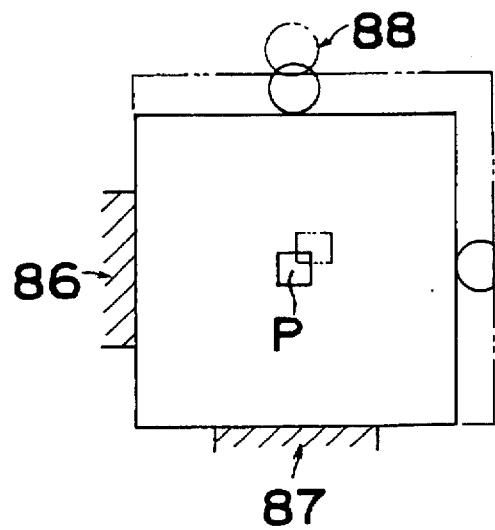
FIG. 23A is an explanatory view showing a state in mounting the IC component on the circuit board by heating the IC component according to a conventional method.
Figure 23B:
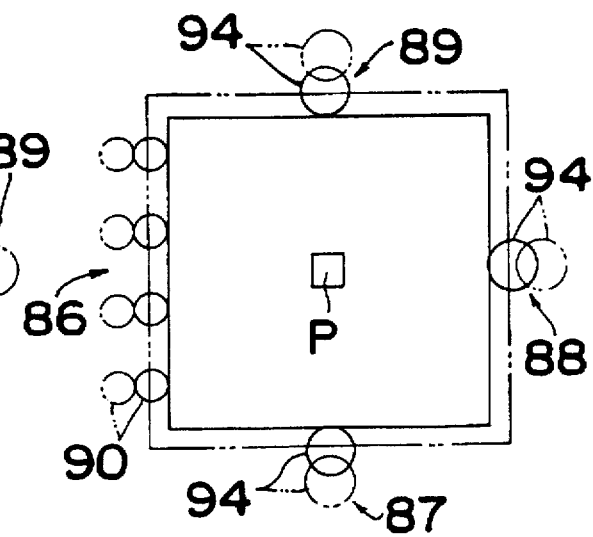
FIG. 23B is an explanatory view showing a state in mounting the IC component on the circuit board by heating the IC component according to the embodiment of the present invention.
Figure 24:
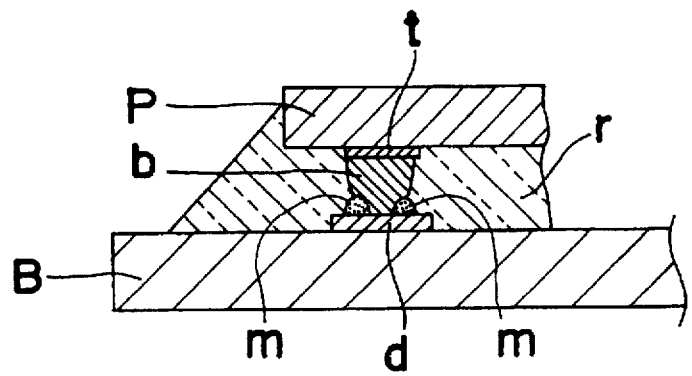
FIG. 24 is a vertical sectional view showing a state in which the IC component is mounted on the circuit board according to the embodiment of the present invention.

If the first and second reference side-regulation means 86 and 87 are stationary and if the movable side-regulation means 88 and 89 are moved backward by the thermal expansion amount of the circuit board (B) during the heating and pressurization, the correct mounting position of the IC component (p) shifts to the position shown by an imaginary line of FIG. 23A. The IC component (P) is, however, fixed by the tool 41 in; the position shown by a solid line. Thus, the mounting position of the IC component (P) is dislocated from the correct mounting position. In order to prevent the above-described disadvantage, during the heating and pressurization of the IC component (P), as shown in FIG. 23B, the regulation rollers 90 of the first reference side-regulation means 86, the regulation roller 94 of the second reference side-regulation means 87, and the regulation rollers 94 of the movable side-regulation means 88 and 89 are moved from regulation positions shown by a solid line to move-away positions shown by an imaginary line. This construction allows the circuit board (B) to be expanded in the four directions. Thus, the mounting position of the IC component (P) can be prevented from being dislocated.

When the thermosetting adhesive agent (r) has been hardened in a predetermined period of time of the pressurization and heating of the IC component (P), with the bumps (b) of the IC component (P) bonded to the electrodes (d) of the circuit board (B) with the silver paste (m), cooling air is blown from the cooling air nozzle 54 toward the tool 41 and the mounting portion in accordance with the profile shown in FIG. 26 at step S71. Then, the pressurization of the IC component (P) is stopped to complete the mounting operation.

The required IC components (P) are mounted on the circuit board (B) placed on the circuit board-setting table 3, by repeating the above-described operations. In the mounting operation, if it is necessary to replace the sucking nozzle 35 and the tool 41 with those corresponding to the subsequent IC component (P) having a configuration and a size different from those of the IC component (P) previously mounted on the circuit board (B), the movable member 32 is moved to the nozzle changer 13 and the mounting head 5 is moved to the tool changer 9 at steps 58 and 80 before mounting the subsequent IC component (P) on the circuit board (B).

In order to correct a dislocation which occurs owing to thermal expansion and contraction of the mounting robot 4 caused by a change in atmospheric temperature and a dislocation which occurs with the elapse of time such as a dislocation of a recognized position which occurs owing to expansion and contraction of adhesive agent used in an optical system caused by the change in moisture, the data of the mounting position is automatically corrected by measuring a dislocation amount at regular intervals by means of the detection means 12.

Figure 27:
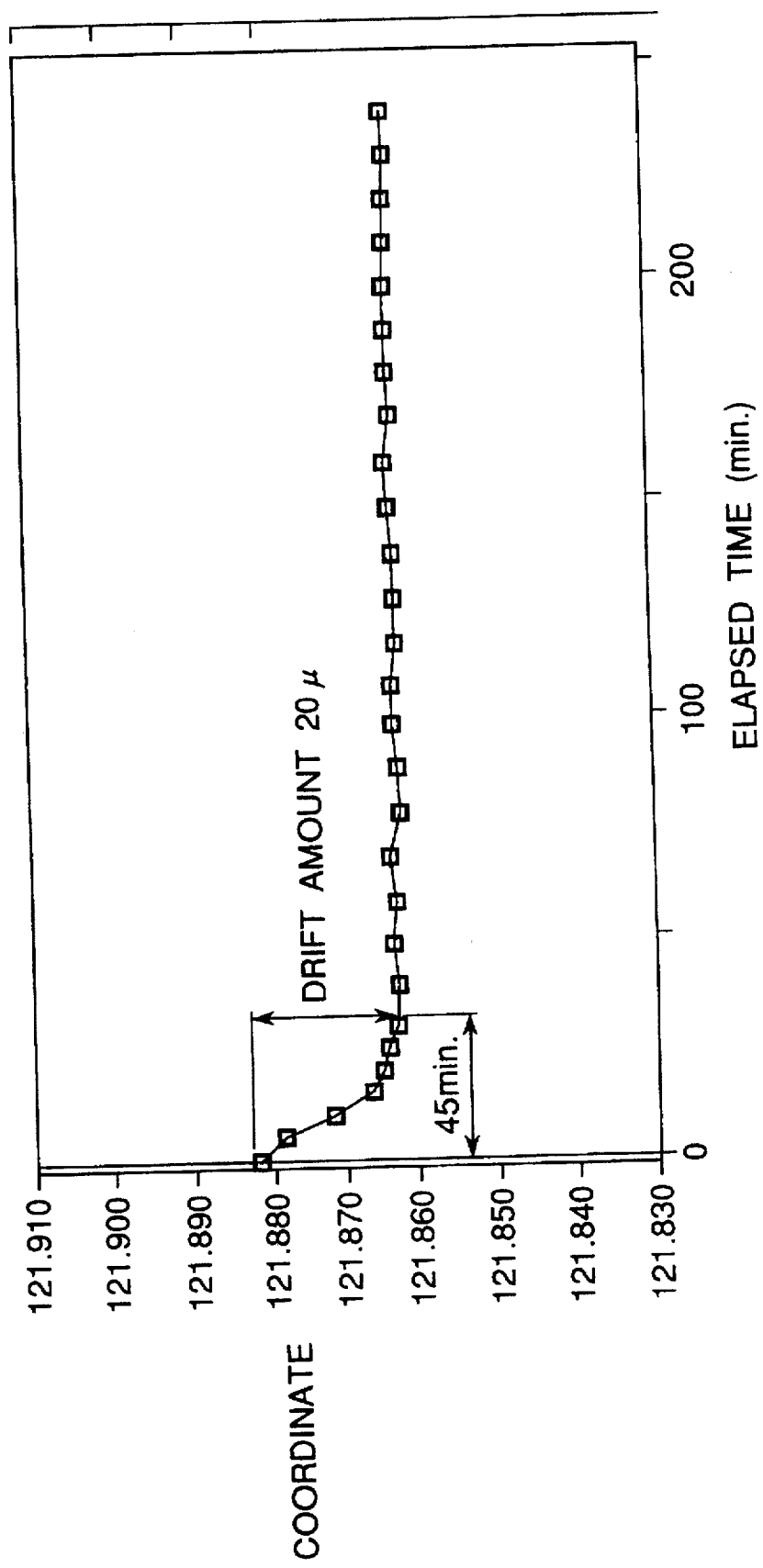
FIG. 27 is a graph showing an example of change in IC component (P) mounting position of the apparatus with coordinates of the position measured from a starting time.
Figure 28:
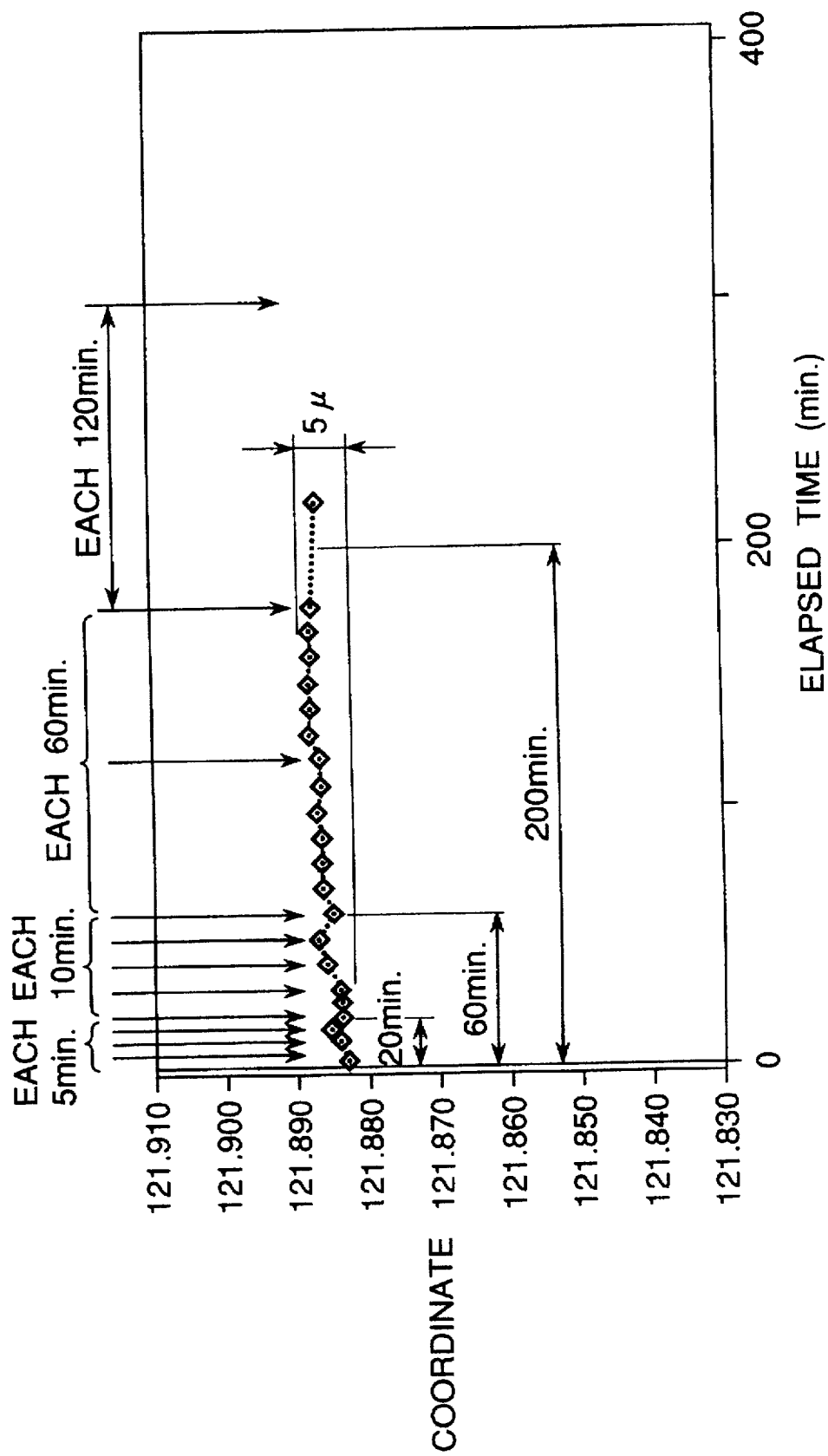
FIG. 28 is a graph showing one example of a manner wherein interval of the usage of the detection means is changed depending on the elapsed period of time.

FIG. 27 shows a graph showing an example of change in IC component (P) mounting position of the apparatus with coordinates of the position measured from a starting time. FIG. 27 clearly shows such a general tendency that the drift amount of approximately 20 μm is suddenly created at approximately 45 minute from the stating time and thereafter the drift amount of the position is decreased so that the amount is stably maintained to a small value. This is caused because the apparatus starts thermal deformation caused by heat generated from the apparatus after the drive of the apparatus is started and then after a specified period of time, the heat release value of the heat is approximately equal to the heat radiation value thereof to make the temperature constant. Based on this tendency, in the apparatus according to the embodiment, the detection means 12 is not simply used for each specified period of time, but the interval of the usage of the detection means 12 change depending on the elapsed period of time. One example is shown in FIG. 28. Where the detection means 12 is used each five minutes during a period from the starting time to 20 minutes, each ten minutes during a period from the starting time to 60 minutes, each 60 minutes for a period from the starting time to 200 minutes, and each 120 minutes for a period of 200 minutes later from the starting time under the control of a timer controller 880 in FIG. 30B.

Figure 29:
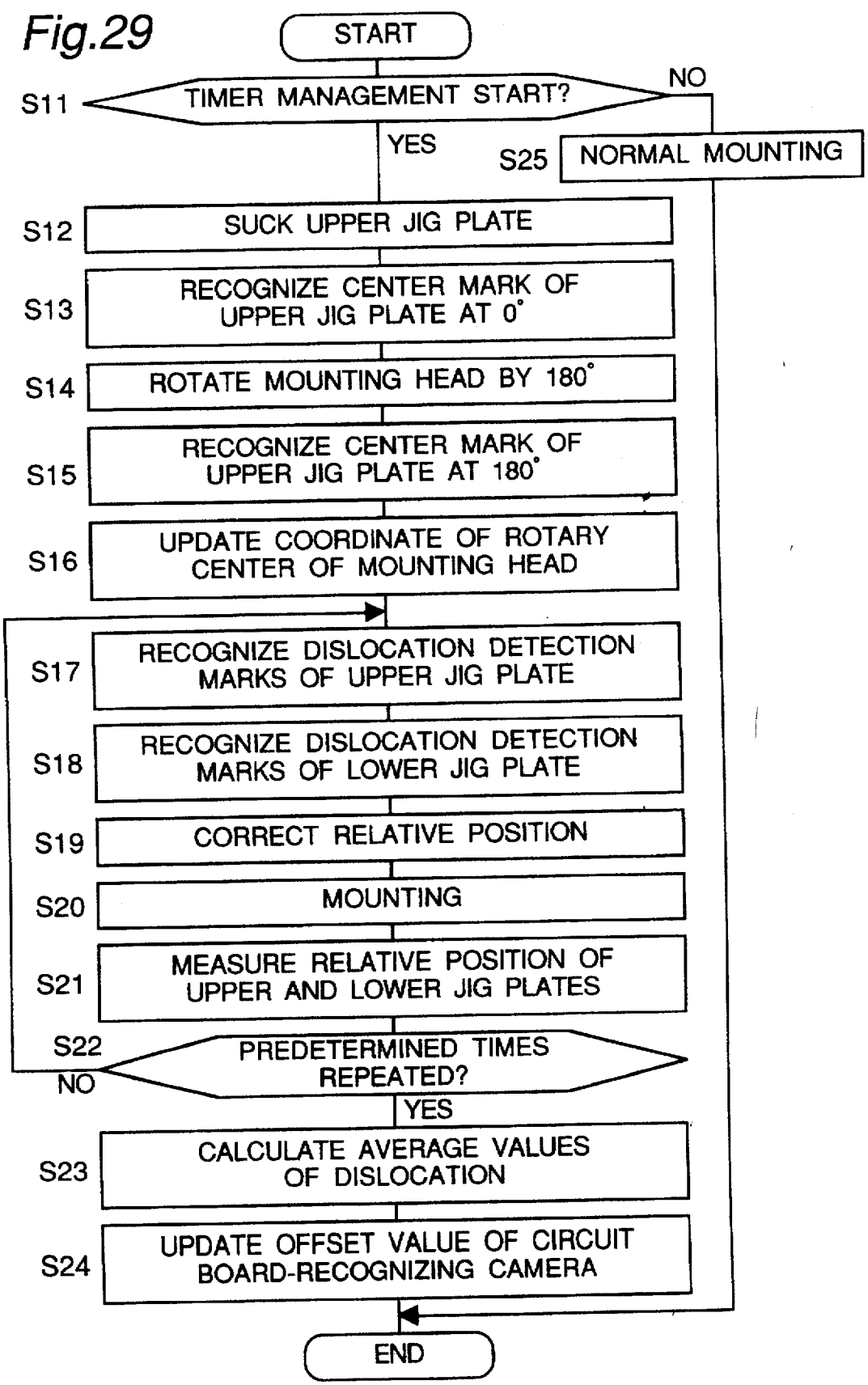
FIG. 29 is a flowchart indicating an operation of the calibration in the manner of FIG. 28.

FIG. 29 shows a flowchart indicating an operation of the calibration in the manner of FIG. 28.

At step S11, it is decided whether or not the timer management is started by the timer controller 880 after a specified period of time is elapsed. When the timer management is not started, the normal mounting operation is carried out at step S25. When the timer management is started at step S11, the upper jig plate 124 is sucked by the tool 41 at step S12. That is, the mounting head 5 is positioned on the optical axis of the recognizing camera 8, with the upper jig plate 124 being sucked by the tool 41, so that the center mark 126 of the upper jig plate 124 is recognized by the recognizing camera 8 at step S13. Then, the tool 41 is rotated by 180° at step S14 to recognize the center mark 126 of the upper jig plate 124 again at step S15. The midpoint of the two recognized points is the center coordinate of the mounting head 5. If the value of the midpoint has changed with respect to an initial value, the change amount is considered to be a dislocation amount and an offset data is corrected at step S16.

In order to correct a dislocation in the mounting position which has occurred due to a dislocation between the circuit board-recognizing camera 43 and the tool 41, the upper jig plate 124 is sucked by the tool 41, and the dislocation detection marks 127a and 127b formed on the diagonal line of the upper jig plate 124 are recognized by the recognizing camera 8 at step S17. The sucking position of the upper jig plate 124 is calculated based on the recognized positions of the dislocation detection marks 127a and 127b and the position of the mounting head 5. Then, the mounting head 5 is moved above the detection means 12, and the dislocation detection marks 128a and 128b of the lower jig plate 122 are detected by the circuit board-recognizing camera 43 at step S18 to find the mounting position of the IC component (P). Then, correction of the relative position is made at step S19 and then the upper jig plate 124 held by the tool 41 is installed on the lower jig plate 122 and fixedly sucked to the sucking hole 123 at step S20. With the upper jig plate 124 temporarily mounted on the lower jig plate 122, the relative positions of the dislocation detection marks 127a and 128a are found by placing them in the visual field of the circuit board-recognizing camera 43 at step S21, as shown by an imaginary line of FIG. 19B. Then, the relative positions of the dislocation detection marks 127b and 128b are found by placing them in the visual field of the circuit board-recognizing camera 43 as well as at step S21. In this manner, a dislocation amount between the lower jig plate 122 and the upper jig plate 124 is found. This operation is repeated at a plurality of times, i.e. predetermined times, at step S22 to find the average value of the dislocation amounts between the lower jig plate 122 and the upper jig plate 124 at step S23. Then, a correction of the offset data between the circuit board-recognizing camera 43 and the tool 41 is performed based on the average value at step S24. The above-described corrections are made at appropriate intervals to eliminate dislocation errors which occur due to the elapse of time. Thus, the IC component (P) can be mounted on the circuit board (B) with high accuracy.

In the embodiment, when the marks are formed on the upper and lower jig plates 124 and 122, a pattern forming method with very high accuracy is required. For example, a method is preferable for forming a thin film made of chrome Cr, indium-tin-oxide ITO, nickel Ni, aluminum Al, gold Au, or etc. having a thickness of 1000 Å–5000 Å.

The upper and lower jig plates 124 and 122 are required to have low coefficients of linear expansion, and for example, the plates are preferably made of corning glass etc. having coefficients of linear expansion of approximately 1–6 PPM.

In the above-described embodiment, the silver paste (m) is transferred to the bumps (b) of the IC component (P) by the transfer means 10 during the mounting of the IC component (P) on the circuit board (B). But it is possible to transfer the silver paste (m) to the bumps (b) of the IC component (P) before mounting the IC component (P) on the circuit board (B). This method eliminates the provision of the transfer means 10.

In the above-described embodiment, description has been made on the IC component (P) consisting of the flip chip IC to be supplied to the supply position in the face-up state in mounting the IC component (P) on the circuit board (B). Even in mounting the IC component (P) on the circuit board (B) to be supplied to the supply position in the face-down state, the provision of the suction/inversion/transport means can be eliminated.

In FIGS. 1A and 1B, when the same type of IC components are mounted on the circuit board (B), the operations at steps S58, S60, S80, S81, S82, and S84 can be eliminated. Also, in FIGS. 1A and 1B, the operations at steps S51, S55, S57, S62, S63, S64, S67, S69, S70, and S71 can be eliminated depending on types of circuit board, types of IC component, atmosphere, conditions, and etc.

According to the embodiment of the present invention, the apparatus and method can be applied to three cases where a plurality of types of IC components (P) are mounted on one circuit board (B); where the same type of IC components (B) are mounted on one circuit board (B); and where a plurality of types of IC components (P) are mounted on a plurality of circuit boards (B). Specially, when a plurality of types of IC components (P) are mounted on one circuit board (B) or a plurality of circuit boards (B), the tool change operation is required as described above.

As one example of the degree of the inclination adjustment, the adjustment is carried out within 0.003–0.005μ.

According to the IC component mounting method of a first aspect of the present invention; the IC component is sucked at the supply position; the sucked IC component is inverted; and the inverted IC component is sucked by the mounting head. Therefore, the method allows the IC component to be supplied to the supply position, with the electrode-provided face thereof to be bonded to a circuit board turned upward and hence, an operation for turning the electrode-provided face of the IC component downward is eliminated, thus improving productivity and eliminating a possibility that the electrode of the IC component is damaged during the transport of the IC component and that thus an appropriate bonding state between the IC component and the circuit board cannot be obtained.

In sucking the IC component at the supply position, the sucking nozzle is placed at the sucking position at which the sucking nozzle does not interfere with the electrode of the IC component, and the position of the sucking nozzle in a vertical direction is controlled in order to stop the sucking nozzle at a position immediately before the sucking nozzle contacts the IC component. Thus, there is no possibility that when the IC component is supplied to the supply position by turning the electrode-provided face of the IC component upward, the sucking nozzle contacts the electrode of the IC component, thus damaging the electrode; an appropriate sucking state cannot be obtained; and the sucking nozzle forcefully collides with the electrode-provided face of the IC component, thus damaging the circuit of the IC component.

According to the IC component mounting method of a second aspect of the present invention, when the circuit board comprises a multilayer board made of glass epoxy resin, even though the entire circuit board is wavy and slight inclinations are generated on the surface of the circuit board at each mounting position thereof due to irregularities caused by a wiring pattern of an underlayer, the IC component can be mounted in parallel with each mounting position of the circuit board by adjusting the inclination of the circuit board-setting table in accordance with that of the IC component-mounting position. Thus, the electrode of the IC component and that of the circuit board can be appropriately bonded to each other.

In order to detect the inclination of the IC component-mounting position of the circuit board, the electrode of the IC component to be bonded to the circuit board or a portion corresponding to the electrode can be plastically deformed by pressing the IC component or a model against the IC component-mounting position of the circuit board to detect the height of the electrode or that of the portion corresponding to the electrode. Hence, even a slight inclination of the IC component-mounting position of the circuit board can be detected with high accuracy and appropriately in accordance with the mounting state of each IC component.

According to the IC component mounting method of a third aspect of the present invention, when heat is applied to the IC component in mounting the IC component on the circuit board, the position of the circuit board is not regulated. Thus, even though the circuit board is thermally expanded, it can be expanded in the four directions from the IC component-mounting position. Accordingly, the IC component-mounting position of the IC component (P) can be prevented from being dislocated. In this manner, the IC component can be mounted on the circuit board with high accuracy.

According to the IC component mounting apparatus of a fourth aspect of the present invention, the suction/inversion/transport means comprises the movable member reciprocating between the supply position and the transfer position; the sucking nozzle vertically movable and invertible; and the height detection means; and the image-recognizing means. The sucking nozzle, the height detection means, and the image-recognizing means are installed on the movable member. The apparatus having this construction is capable of carrying out the IC component mounting method of the first aspect of the present invention efficiently.

According to the IC component mounting apparatus of a fifth aspect of the present invention, the mounting head comprises the means pressurizing for applying a pressure to the tool; and the means for detecting the pressure applied to the tool. The pressure to be applied to the tool can be appropriately adjusted by controlling the operation of the pressurizing means in accordance with the detected pressure applied thereto by the pressurizing means. Therefore, there is no possibility that a bump constituting the electrode of the IC component is broken and thus, an unfavorable insulation occurs between the electrode of the IC component and electrodes adjacent thereto if an excessive pressure is applied to the tool and that the electrode of the IC component is unfavorably bonded to the electrode of the circuit board if a low pressure is applied to the tool. Thus, an appropriate bonding state can always be obtained.

According to the IC component mounting apparatus of a sixth aspect of the present invention, the heater and the (first) temperature detection means are provided on the tool-installing portion of the mounting head. Thus, the temperature of the tool can be adjusted to a desired one. When it is necessary to heat the IC component in bonding electrodes to each other, an appropriate bonding state can always be obtained.

Preferably, the means (second temperature detection means) for detecting the temperature of the IC component-sucking face of the tool is provided. The relationship is found in advance between the temperature of the tool-installing portion detected by the first temperature detection means and the temperature of the IC component-sucking face detected by the second temperature detection means. In this manner, the temperature of the IC component-sucking face can be adjusted to a desired temperature accurately, based on the temperature detected by the (first) temperature detection means.

According to the IC component mounting apparatus of a seventh aspect of the present invention, the tool has the flat member having the mounting face parallel with the IC component-sucking face, and the tool-sucking hole is formed on the tool contact face of the tool-installing portion. This construction facilitates the installation of the tool on the tool-installing portion and the removal therefrom, with while maintaining a high degree of parallel between the IC component-sucking face and the mounting face. In addition, pressure is transmitted to the tool smoothly and there is no possibility that the tool is deformed by the pressure applied thereto. Further, heat is transmitted to the tool efficiently.

Thus, the temperature of the tool can be controlled with fast response and high accuracy.

The tool-installing portion is installed on the mounting head through the heat transmission regulation portion having a small area and the cooling means. This construction reliably prevents heat from being transmitted to the mounting head even when heat is applied to the IC component in mounting the IC component on the circuit board by providing the tool-installing portion with a heating means. Hence, the apparatus can be prevented from being expanded or contracted entirely. Therefore, errors can be prevented from occurring in the component-mounting position.

According to the IC component mounting apparatus of an eighth aspect of the present invention, there is provided the automatic adjusting means for adjusting the inclination of the circuit board-setting table. This construction is capable of carrying out the IC component mounting method of the second aspect of the present invention favorably.

There is provided the automatic adjusting means for automatically adjusting the inclination of a given portion of the circuit board-setting table without changing the height of the given portion. Therefore, the mounting position and the recognizing position is not changed vertically. Thus, the component-mounting operation can be performed with ease.

The automatic adjusting means comprises guide means for guiding vertical movement of the circuit board-setting table; and the means for supporting the circuit board-setting table such that the heights of the three points formed on the lower face thereof can be adjusted independently of each other. Although simple, this construction is capable of adjusting the heights of the three points accurately.

According to the IC component mounting apparatus of a ninth aspect of the present invention, the position of the circuit board can be expanded in all directions by moving the reference side-regulation means and the movable side-regulation means both for regulating the position of the circuit board toward the circuit board-unregulated position when the IC component is mounted on the circuit board by heating it. This construction is capable of carrying out the IC component mounting method of the third invention favorably.

Although the present invention has been fully described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims unless they depart therefrom.

What is claimed is:

1. An IC component mounting method comprising:
   recognizing, at a supply position, an image of one of different types of IC components in order to detect a sucking position at which a sucking nozzle will not interfere with electrodes provided on a face of said IC component which is to be bonded to a circuit board;
   detecting a height of said sucking position;
   positioning said sucking nozzle at said sucking position while the position of said sucking nozzle in a vertical direction is controlled;
   sucking said IC component with said sucking nozzle at said supply position;
   transferring and discharging said IC component at a transfer position;
   sucking said IC component by a mounting head;

recognizing a position of said IC component sucked by said mounting head, and recognizing a reference position of said circuit board or an IC component-mounting position thereof;

positioning said IC component at said IC component mounting position of said circuit board; and mounting said IC component on said circuit board.

2. The IC component mounting method as claimed in claim 1, further comprising:

supplying said IC component to said supply position with said IC component face having said electrodes facing upwardly; and inverting said sucked IC component prior to sucking said IC component by said mounting head.

3. An IC component mounting method comprising:

detecting an inclination of a circuit board which is set on a circuit board setting table at each of a plurality of IC component-mounting positions;

adjusting an inclination of said circuit board setting table in accordance with the inclination of each of said IC component-mounting positions for each of a plurality of IC components;

sucking each of said plurality of IC components by a mounting head;

recognizing a position of said IC component sucked by said mounting head, and recognizing a reference position of said circuit board or one of said IC component-mounting positions on said circuit board;

positioning said IC component at said IC component-mounting position of said circuit board; and mounting said IC component on said circuit board.

4. The IC component mounting method as claimed in claim 3, wherein during the mounting of said IC component, a face of said IC component which is provided with electrodes is brought into contact with a surface of said circuit board.

5. The IC component mounting method as claimed in claim 4, wherein during said inclination detecting operation, one of said electrodes of said IC component to be bonded to said circuit board or a portion corresponding to said electrode is plastically deformed by pressing said IC component or a model against said IC component-mounting position of said circuit board, and a height of said electrode or that of said portion corresponding to said electrode is detected in order to detect the inclination of said IC component-mounting position of said circuit board.

6. An IC component mounting method comprising:

sucking an IC component with a mounting head;

recognizing a position of said IC component sucked by said mounting head, and recognizing a reference position of a circuit board or an IC component mounting position of said circuit board;

mounting said IC component on said circuit board by positioning said IC component at said IC component-mounting position of said circuit board; and heating said IC component while mounting said IC component on said circuit board.

7. An IC component mounting apparatus comprising:

an IC component supply device for supplying each of a plurality of different types of IC components to a supply position by turning an electrode-bearing face of a supplied IC component into an upward orientation;

a suction/inversion/transport apparatus for sucking the IC component at the supply position, inverting the IC component, and transporting the IC component toward a transfer position, said suction/inversion/transport apparatus including a movable member reciprocating between the supply position and the transfer position, a vertically movable and invertible sucking nozzle, a height detector, and an image-recognizing device, wherein said sucking nozzle, said height detector, and said image recognizing device are installed on said movable member;

a circuit board-setting table for supporting a circuit board and controlling a position of the circuit board on said circuit board-setting table;

a mounting head including a tool for sucking the IC component at the transfer position and mounting the IC component on the circuit board at an IC component-mounting position of the circuit board, and a circuit board recognizing device for recognizing an image of a reference position of the circuit board or that of each of a plurality of component-mounting positions; and a component recognizing device for recognizing the position of the IC component sucked by said tool.

8. The IC component mounting apparatus as claimed in claim 7, wherein said IC component supply device is placed in position by moving a tray which accommodates the IC components in a direction which is perpendicular to a movement direction of said movable member.

9. The IC component mounting apparatus as claimed in claim 7, wherein said tool includes a flat member having an IC component-sucking face and a mounting face arranged in parallel with said IC component-sucking face, and a sucking hole extending between said IC component-sucking face and said mounting face.

10. The IC component mounting apparatus as claimed in claim 9, wherein said mounting head further includes a tool-installing portion which is connected to said mounting head through a heat transmission regulation portion which has a reduced area and a cooling mechanism.

11. An IC component mounting apparatus comprising:

an IC component supply means for supplying an IC component;

a circuit board-setting table for supporting a circuit board on which the IC component is to be mounted and controlling a position of the circuit board;

a mounting head including a tool for sucking the supplied IC component and mounting the IC component on the circuit board at an IC component-mounting position, and a circuit board recognizing device for recognizing an image of a reference position of the circuit board or that of the IC component-mounting position; and a component recognizing device for recognizing the position of the IC component sucked by said tool, wherein said mounting head further includes a pressure applying device for applying pressure to said tool, and a pressure detector for detecting the pressure applied to said tool in order to maintain a constant pressure applied to the sucked component based on the pressure detected by said pressure detector.

12. An IC component mounting apparatus comprising:

an IC component supply device for supplying an IC component;

a circuit board-setting table for supporting a circuit board on which the IC component is to be mounted by positioning a circuit board;

a mounting head including a tool for sucking the supplied IC component at an IC component mounting face of said tool, and for mounting the IC component on the circuit board at an IC component-mounting position of said circuit board, and a circuit board recognizing device for recognizing an image of a reference position of the circuit board or that of the IC component-mounting position, said tool having a temperature detector for detecting the temperature of said IC component-sucking face of said tool; and a heater and a temperature detector provided on a tool-installing portion of said mounting head.

13. An IC component mounting apparatus comprising:

an IC component supply device for supplying an IC component;

a circuit board-setting table for supporting a circuit board on which the IC component is to be mounted by controlling a position of the circuit board;

a mounting head including a tool for sucking the supplied IC component and mounting the IC component on the circuit board at an IC component-mounting position, and a circuit board recognizing device for recognizing an image of a reference position of the circuit board or that of the IC component-mounting position;

a component recognizing device for recognizing a position of the IC component sucked by said tool; and an automatic adjusting mechanism for adjusting an inclination of said circuit board-setting table.

14. The IC component mounting apparatus as claimed in claim 13, wherein said automatic adjusting means automatically adjusts the inclination of a specific portion of said circuit board-setting table without changing a height of said specific portion.

15. The IC component mounting apparatus as claimed in claim 14, further comprising a guide device for guiding vertical movement of said circuit board-setting table; and a means for supporting said circuit board-setting table such that heights of three points formed on a lower face thereof can be adjusted independently of each other.

16. An IC component mounting apparatus comprising:

an IC component supply device for supplying an IC component;

a circuit board-setting table for a supporting a circuit board on which the IC component is to be mounted;

a mounting head including a tool for sucking the supplied IC component and mounting the IC component on the circuit board at an IC component-mounting position thereof, and a circuit board recognizing device for recognizing an image of a reference position of the circuit board or that of the IC component-mounting position;

a tool heater;

an IC component recognizing device for recognizing a position of the IC component sucked by said tool;

a reference side-regulation device engaging two adjacent sides of four sides of the circuit board positioned on said circuit board-setting table, and thus controlling the position of the circuit board;

a movable side-regulation device for pressing the remaining two adjacent sides of the circuit board toward said reference side-regulation device, and thus controlling the position of the circuit board; and a means for moving said reference side-regulation device toward a circuit board position of said circuit board-setting table.

* * * * *